United States Patent
Nakamura et al.

(10) Patent No.: US 8,015,462 B2
(45) Date of Patent: Sep. 6, 2011

(54) TEST CIRCUIT

(75) Inventors: Yoshiyuki Nakamura, Kanagawa (JP);
Toshiharu Asaka, Kanagawa (JP);
Toshiyuki Maeda, Kanagawa (JP);
Tomonori Sasaki, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 515 days.

(21) Appl. No.: 12/149,742

(22) Filed: May 7, 2008

(65) Prior Publication Data
US 2008/0281547 A1  Nov. 13, 2008

(30) Foreign Application Priority Data

May 11, 2007  (JP) .................................. 2007-127173
Oct. 29, 2007  (JP) .................................. 2007-280745

(51) Int. Cl.
*G01R 31/28* (2006.01)
(52) U.S. Cl. ........................................................ 714/727
(58) Field of Classification Search .................. 714/30, 714/724, 726, 727, 729, 733, 734
See application file for complete search history.

(56) References Cited

U.S. PATENT DOCUMENTS

| | | | |
|---|---|---|---|
| 6,324,662 B1 * | 11/2001 | Haroun et al. | 714/724 |
| 6,334,198 B1 * | 12/2001 | Adusumilli et al. | 714/727 |
| 6,385,749 B1 * | 5/2002 | Adusumilli et al. | 714/733 |
| 6,711,707 B2 * | 3/2004 | Haroun et al. | 714/726 |
| 7,213,171 B2 * | 5/2007 | Haroun et | 714/30 |
| 7,574,637 B2 * | 8/2009 | Ricchetti et al. | 714/724 |
| 2004/0163012 A1 * | 8/2004 | Hayase | 714/25 |
| 2004/0268181 A1 * | 12/2004 | Wang et al. | 714/30 |
| 2007/0226558 A1 * | 9/2007 | Ikeda et al. | 714/724 |
| 2008/0059855 A1 * | 3/2008 | Whetsel | 714/727 |
| 2010/0031100 A1 * | 2/2010 | Swoboda | 714/726 |
| 2010/0174958 A1 * | 7/2010 | Maeda et al. | 714/727 |

FOREIGN PATENT DOCUMENTS

| | | |
|---|---|---|
| JP | 10-115668 | 5/1998 |
| JP | 2002-373086 | 12/2002 |
| JP | 2004-164367 | 6/2004 |
| JP | 2005-527918 | 9/2005 |

* cited by examiner

*Primary Examiner* — Jeffrey A Gaffin
*Assistant Examiner* — Daniel F McMahon
(74) *Attorney, Agent, or Firm* — McGinn Intellectual Property Law Group, PLLC

(57) ABSTRACT

A test circuit including a TAP controller specified in IEEE (Institute of Electrical and Electronics Engineers) 1149 and a test access port includes a first controller including a selecting circuit and a first TAP controller, the selecting circuit generating an internal TMS signal in accordance with TMS signal and selecting an output destination of the internal TMS signal in accordance with a selection signal, and the first TAP controller changing internal state based on the internal TMS signal, testing corresponding test target block in accordance with instruction code for test, and generating the selection signal in accordance with instruction code for selection, and a second controller including a second TAP controller changing internal state based on the internal TMS signal and testing corresponding test target block in accordance with the instruction code for test.

15 Claims, 23 Drawing Sheets

| OE1 | OE2 | OE3 | TDO |
|---|---|---|---|
| 1 | 0 | 0 | TDO_1 |
| 0 | 1 | 0 | TDO_2 |
| 0 | 0 | 1 | TDO_3 |

Fig. 12

| INSTRUCTION CODE FOR SELECTION | SELECTION SIGNALS THAT ARE TO BE ACTIVE |
|---|---|
| 00101 (RESET INITIAL VALUE) | TE1+OE1 |
| 01010 | TE2+OE2 |
| 10011 | TE3+OE3 |
| 01101 | TE1+TE2+OE1 |
| 01110 | TE1+TE2+OE2 |
| 10101 | TE1+TE3+OE1 |
| 10111 | TE1+TE3+OE3 |
| 11010 | TE2+TE3+OE2 |
| 11011 | TE2+TE3+OE3 |
| 11101 | TE1+TE2+TE3+OE1 |
| 11110 | TE1+TE2+TE3+OE2 |
| 11111 | TE1+TE2+TE3+OE3 |

Fig. 13

| INSTRUCTION CODE FOR SELECTION | SELECTION SIGNALS THAT ARE TO BE ACTIVE |
|---|---|
| 00101 | TE1+OE1 |
| 01010 | TE2+OE2 |
| 10011 | TE3+OE3 |
| 01101 | TE1+TE2+OE1 |
| 01110 (RESET INITIAL VALUE) | TE1+TE2+OE2 |
| 10101 | TE1+TE3+OE1 |
| 10111 | TE1+TE3+OE3 |
| 11010 | TE2+TE3+OE2 |
| 11011 | TE2+TE3+OE3 |
| 11101 | TE1+TE2+TE3+OE1 |
| 11110 | TE1+TE2+TE3+OE2 |
| 11111 | TE1+TE2+TE3+OE3 |

Fig. 14

| OE1 | OE2 | OE3 | TCK | TDO |
|---|---|---|---|---|
| 1 | 0 | 0 | - | TDO_1 |
| 0 | 1 | 0 | - | TDO_2 |
| 0 | 0 | 1 | - | TDO_3 |
| 1 | 1 | 0 | 0 | TDO_1 |
| 1 | 1 | 0 | 1 | TDO_2 |
| 0 | 1 | 1 | 0 | TDO_2 |
| 0 | 1 | 1 | 1 | TDO_3 |
| 1 | 0 | 1 | 0 | TDO_1 |
| 1 | 0 | 1 | 1 | TDO_3 |

Fig. 16

| INSTRUCTION CODE FOR SELECTION | SELECTION SIGNALS THAT ARE TO BE ACTIVE |
|---|---|
| 001001 (RESET INITIAL VALUE) | TE1+OE1 |
| 010010 | TE2+OE2 |
| 100100 | TE3+OE3 |
| 011001 | TE1+TE2+OE1 |
| 011010 | TE1+TE2+OE2 |
| 011011 | TE1+TE3+OE1+OE2 |
| 101001 | TE1+TE3+OE1 |
| 101100 | TE1+TE3+OE3 |
| 101101 | TE1+TE3+OE1+OE3 |
| 110010 | TE2+TE3+OE2 |
| 110100 | TE2+TE3+OE3 |
| 110110 | TE2+TE3+OE2+OE3 |
| 111001 | TE1+TE2+TE3+OE1 |
| 111010 | TE1+TE2+TE3+OE2 |
| 111100 | TE1+TE2+TE3+OE3 |
| 111011 | TE1+TE2+TE3+OE1+OE2 |
| 111101 | TE1+TE2+TE3+OE1+OE3 |
| 111110 | TE1+TE2+TE3+OE2+OE3 |

Fig. 17

| OE1 | OE2 | OE3 | TDO |
|---|---|---|---|
| 1 | 0 | 0 | TDO_1 |
| 0 | 1 | 0 | TDO_2 |
| 0 | 0 | 1 | TDO_3 |
| 1 | 1 | 0 | TDO_1^TDO_2 |
| 0 | 1 | 1 | TDO_2^TDO_3 |
| 1 | 0 | 1 | TDO_1^TDO_3 |
| 1 | 1 | 1 | TDO_1^TDO_2^TDO_3 |

Fig. 19

| INSTRUCTION CODE FOR SELECTION | SELECTION SIGNALS THAT ARE TO BE ACTIVE |
| --- | --- |
| 001001 (RESET INITIAL VALUE) | TE1+OE1 |
| 010010 | TE2+OE2 |
| 100100 | TE3+OE3 |
| 011001 | TE1+TE2+OE1 |
| 011010 | TE1+TE2+OE2 |
| 011011 | TE1+TE3+OE1+OE2 |
| 101001 | TE1+TE3+OE1 |
| 101100 | TE1+TE3+OE3 |
| 101101 | TE1+TE3+OE1+OE3 |
| 110010 | TE2+TE3+OE2 |
| 110100 | TE2+TE3+OE3 |
| 110110 | TE2+TE3+OE2+OE3 |
| 111001 | TE1+TE2+TE3+OE1 |
| 111010 | TE1+TE2+TE3+OE2 |
| 111100 | TE1+TE2+TE3+OE3 |
| 111011 | TE1+TE2+TE3+OE1+OE2 |
| 111101 | TE1+TE2+TE3+OE1+OE3 |
| 111110 | TE1+TE2+TE3+OE2+OE3 |
| 111111 | TE1+TE2+TE3+OE1+OE2+OE3 |

Fig. 20

| OE1 | OE2 | OE3 | TDI_2 | TDI_3 | TDO |
|---|---|---|---|---|---|
| 1 | 0 | 0 | TDI | TDI | TDO_1 |
| 0 | 1 | 0 | TDI | TDI | TDO_2 |
| 0 | 0 | 1 | TDI | TDI | TDO_3 |
| 1 | 1 | 0 | TDO_1 | TDI | TDO_2 |
| 0 | 1 | 1 | TDI | TDO_2 | TDO_3 |
| 1 | 0 | 1 | TDI | TDO_1 | TDO_3 |
| 1 | 1 | 1 | TDO_1 | TDO_2 | TDO_3 |

Fig. 23

TEST CIRCUIT

BACKGROUND OF THE INVENTION

1. Field of the Invention

The present invention relates to a test circuit, and more particularly, to a test circuit including a TAP (Test Access Port) controller defined in IEEE1149.

2. Description of Related Art

A circuit size of a semiconductor device has recently become larger and larger, and a number of terminals performing test on the semiconductor device has been increasing. A package of the semiconductor device becomes larger and miniaturization of the semiconductor device is difficult as the number of terminals is increased. It is therefore required to reduce the number of terminals. In order to achieve this, IEEE (Institute of Electrical and Electronics Engineers) has defined IEEE1149. With IEEE1149.1, which is one of IEEE1149, it is possible to perform test of the semiconductor device using five terminals and a TAP controller. The five terminals are called a TDI terminal, a TRST terminal, a TCK terminal, a TMS terminal, and a TDO terminal. In the following description, a set of TDI terminal, TRST terminal, TCK terminal, TMS terminal, and TDO terminal is called test terminal group. The TAP controller includes a state machine changing internal state based on TMS signal input from the TMS terminal and controls test target block based on commands input from the TDI terminal.

As the circuit size is increased, a plurality of TAP controllers are used according to a number of test target blocks. However if the plurality of TAP controllers are directly implemented, a plurality of test terminal groups need to be provided according to the number of TAP controllers, which means the number of terminals is increased. In order to overcome this problem, Japanese Unexamined Patent Application Publication No. 2004-164367 (hereinafter referred to as related art 1) discloses a technique preventing the number of terminals from being increased even when the plurality of TAP controllers are implemented.

FIG. 24 shows a block diagram of a semiconductor device 1000 disclosed in the related art 1. As shown in FIG. 24, the semiconductor device 1000 includes TAP controllers 1200 and 1300, and CPUs 1220 and 1320 connected to the TAP controllers 1200 and 1300 through debug executing units. In the semiconductor device 1000, a set of test terminal group is included in each of the two TAP controllers. The semiconductor device 1000 further includes a selecting circuit 1100 for selecting connection path connecting the set of test terminal group and the TAP controller 1200 and the TAP controller 1300.

More specifically, the selecting circuit 1100 includes a TAP controller 1110 and a register 1101. The TAP controller 1110 sets the value stored in the register 1101 according to instruction code input from the TDI terminal. The selecting circuit 1100 then selects the connection path connecting the test terminal group and the TAP controller 1200 and the TAP controller 1300 according to the value stored in the register 1101.

The related art 1 also shows an example where the TAP controller is not included in the selecting circuit 1100. In this case, an input terminal of control signal to the selecting circuit 1100 is provided in addition to a set of test terminal group.

Another example of a control method of the plurality of TAP controllers is shown in Japanese Patent Translation Publication No. 2005-527918 (hereinafter referred to as related art 2) and Japanese Unexamined Patent Application Publication No. 2002-373086 (hereinafter referred to as related art 3). In the control method disclosed in the related art 2, the plurality of TAP controllers are controlled by adding the control circuit or other terminal than the test terminal group. In the control method disclosed in the related art 3 as well, the plurality of TAP controllers are controlled by adding the selecting circuit and controlling the selecting circuit according to signals from the test terminal group. The related art controlling the plurality of TAP controllers is disclosed in Japanese Unexamined Patent Application Publication No. 10-115668 (hereinafter referred to as related art 4). In the related art 4, the plurality of TAP controllers are controlled through a TAP link module (hereinafter referred to as control circuit). U.S. Pat. Nos. 6,324,662, 6,711,707, and 7,213,171 are U.S. patents corresponding to Japanese Unexamined Patent Application Publication No. 10-115668.

However, we have now discovered that there are problems in the techniques disclosed in related art 1 to related art 4. The instruction code that is input to the selecting circuit or the control circuit that is added does not comply with a standard specification of IEEE1149.1. Therefore, incompatibility of the instruction code may be raised among semiconductor devices when the circuits are implemented on the substrate with other semiconductor devices, which causes malfunction of behavior of the system.

Further, in related art 2 to related art 4, operation procedure of the selecting circuit or the control circuit does not comply with the standard specification of IEEE1149.1. Therefore, incompatibility of the operation procedure may be raised among semiconductor devices when the circuits are implemented on the board with other semiconductor devices, which causes malfunction of behavior of the system.

SUMMARY

According to one aspect of the present invention, there is provided a test circuit including a TAP controller specified in IEEE (Institute of Electrical and Electronics Engineers) 1149 and a test access port, the test circuit including a first controller including a selecting circuit and a first TAP controller, the selecting circuit generating an internal TMS signal in accordance with TMS signal and selecting an output destination of the internal TMS signal in accordance with a selection signal, and the first TAP controller changing internal state based on the internal TMS signal, testing corresponding test target block in accordance with instruction code for test, and generating the selection signal in accordance with instruction code for selection, and a second controller including a second TAP controller changing internal state based on the internal TMS signal and testing corresponding test target block in accordance with the instruction code for test.

According to another aspect of the present invention, there is provided a test circuit including a plurality of TAP controller specified in IEEE (Institute of Electrical and Electronics Engineers) 1149 and a test access port, the test circuit including a first controller including a selecting circuit and the TAP controller, the selecting circuit generating a plurality of first internal TMS signals in accordance with TMS signal and selecting each of output destinations of a plurality of the first internal TMS signals in accordance with a plurality of first selection signals, and the TAP controller changing internal state based on one of the first internal TMS signal, testing corresponding test target block in accordance with instruction code for test, and generating the plurality of first selection signals in accordance with instruction code for selection, and a plurality of second controllers including the one or more TAP controllers, each of the TAP controllers changing internal state based on corresponding one of the plurality of first internal TMS signals and testing corresponding test target block in accordance with the instruction code for test.

According to further aspect of the present invention, there is provided a test circuit including a master TAP controller having IEEE standard specification upward compatibility where other TAP controllers of standard specification specified in IEEE1149 can be controlled, wherein the master TAP controller including an instruction decoder decoding a code including instruction code for selection selecting any TAP controller from among a plurality of TAP controllers, and a selecting circuit controlling other TAP controllers based on the decode result of the instruction decoder, and a selecting circuit controlling other TAP controllers based on the decode result of the instruction decoder.

According to the test circuit of the present invention, the selecting circuit generates internal TMS signal based on TMS signal input from the TMS terminal provided for each of the plurality of TAP controllers and controls the output destination of the internal TMS signal. Further, the TAP controllers provided in the first and second controllers perform behavior complied with IEEE1149. Therefore, according to the test circuit of the present invention, each of the plurality of TAP controllers can be operated without violating standard of IEEE1149 by selecting the TAP controller controlling and operating the output destination of the internal TMS signal by the selecting circuit.

According to the test circuit of the present invention, it is possible to control each of the plurality of TAP controllers using instruction code complied with IEEE1149 and a set of test access ports without violating standard specification of IEEE1149.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 12 is a truth table of an output selecting circuit according to the sixth embodiment;

FIG. 13 is a diagram showing a relationship of an instruction code for selection to a standard TAP controller and selection signals that are to be active according to the instruction code for selection according to the sixth embodiment;

FIG. 14 is a diagram showing another relationship of an instruction code for selection to a standard TAP controller and selection signals that are to be active according to the instruction code for selection according to the sixth embodiment;

FIG. 16 is a truth table of an output selecting circuit according to the seventh embodiment;

FIG. 17 is a diagram showing a relationship of an instruction code for selection to a standard TAP controller and selection signals that are to be active according to the instruction code for selection according to the seventh embodiment;

FIG. 19 is a truth table of an output selecting circuit according to the eighth embodiment;

FIG. 20 is a diagram showing a relationship of an instruction code for selection to a standard TAP controller and selection signals that are to be active according to the instruction code for selection according to the eighth embodiment;

FIG. 23 is a truth table of an output selecting circuit according to the ninth embodiment.

DETAILED DESCRIPTION OF THE PREFERRED EMBODIMENTS

The invention will now be described herein with reference to illustrative embodiments. Those skilled in the art will recognize that many alternative embodiments can be accomplished using the teachings of the present invention and that the invention is not limited to the embodiments illustrated for explanatory purposes.

In the following description, the present invention will be described by taking IEEE1149.1 that is defined in IEEE1149 as an example. Note that a test circuit where the present invention can be applied is not limited to IEEE1149.1 but can be other standards defined in IEEE1149. The test circuit according to the present invention includes a plurality of TAP controllers. In the following description, a case will be described where these TAP controllers are implemented on one semiconductor chip with a test target circuit. Note that the test circuit of the present invention may be implemented on an evaluation board as a semiconductor device different from the test target circuit, or the plurality of TAP controllers included in the test circuit may be implemented as separate semiconductor device. The embodiments of the present invention will be described hereinafter with reference to the drawings.

First Embodiment

Figure 1:
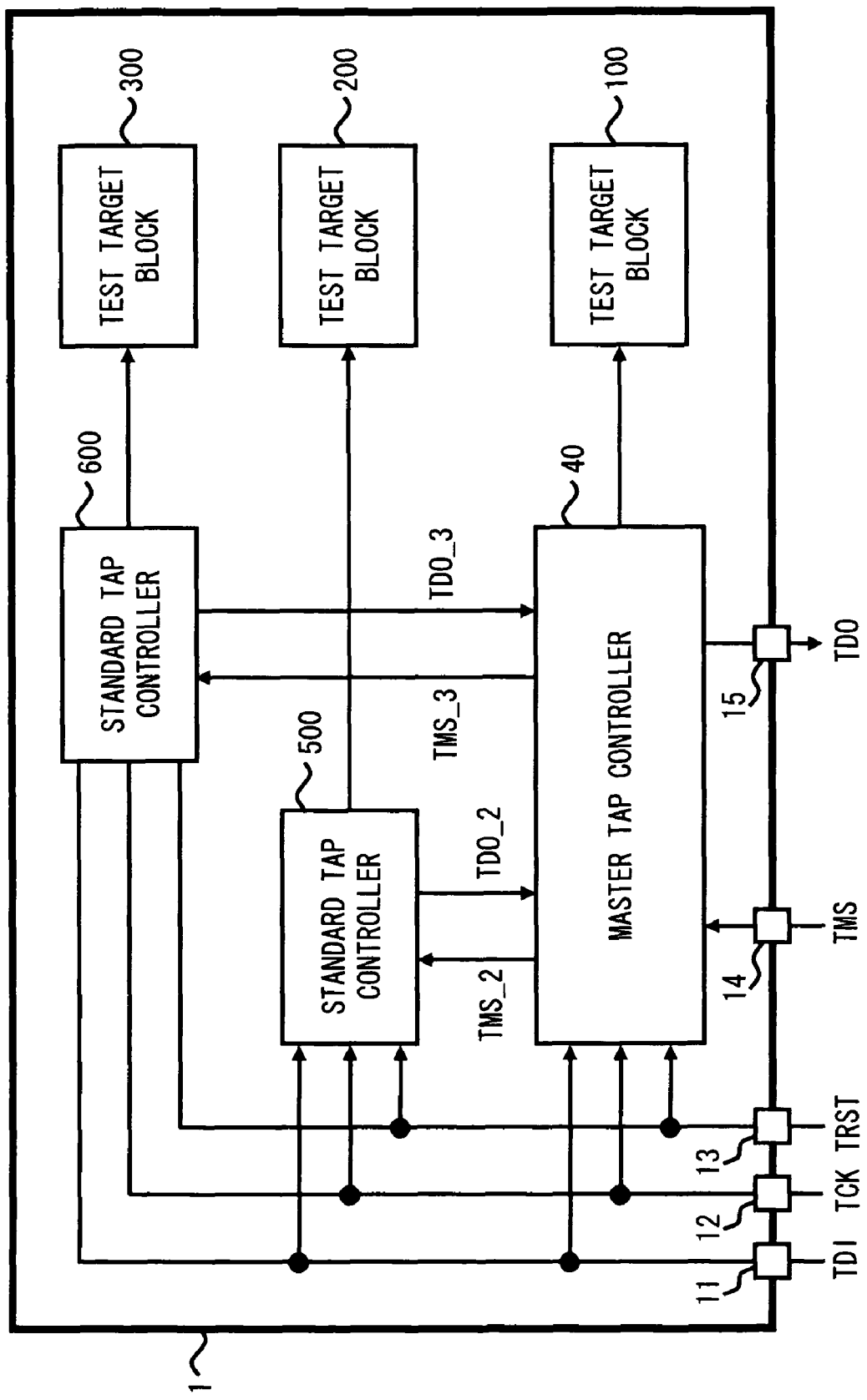
FIG. 1 is a block diagram of a semiconductor device according to a first embodiment.

FIG. 1 shows a block diagram of a semiconductor device 1 according to the present embodiment. As shown in FIG. 1, the semiconductor device 1 includes a TDI terminal 11, a TCK terminal 12, a TRST terminal 13, a TMS terminal 14, a TDO terminal 15, test target blocks 100 to 300, a first controller (master TAP controller, for example) 40, and second controllers (standard TAP controllers, for example) 500, 600. In the following embodiment, circuit part excluding the test target blocks from the semiconductor device 1 is called test circuit. The test circuit includes a first TAP controller having a function of decoding an instruction code for selection and a second TAP controller which does not have to have a function of decoding the instruction code for selection. In the following description, a standard TAP controller 400 embedded in the master TAP controller corresponds to the first TAP controller and the standard TAP controllers 500 and 600 correspond to the second TAP controller. However, the first TAP controller and the second TAP controller both meet the standard defined in IEEE1149.1.

The TDI terminal 11, the TCK terminal 12, the TRST terminal 13, the TMS terminal 14, and the TDO terminal 15 are defined in the IEEE1149. These terminals provided as external terminals of the semiconductor device 1 will hereinafter be called common test terminal group. The TDI terminal 11 is the input terminal of instruction code. The TCK terminal 12 is the input terminal of the clock signal. The TRST terminal 13 is the input terminal of a reset signal. The TMS terminal 14 is the input terminal of the TMS signal. The TDO terminal is the output terminal of the output signal from the test circuit.

The test target block 100 is the circuit block tested by the master TAP controller 40. The test target block 200 is the circuit block tested by the standard TAP controller 500. The test target block 300 is the circuit block tested by the standard TAP controller 600. Although the test target blocks 100 to 300 may operate either independently or cooperatively, it is preferable that the test target blocks 100 to 300 behave independently in test.

The master TAP controller 40 changes internal state according to TMS signal and generates first internal TMS signal supplied to other standard TAP controllers. The master TAP controller 40 also outputs instruction signal for test for the test target block 100 that is connected to the master TAP controller 40. The standard TAP controllers 500 and 600 perform behavior complied with IEEE1149.1. Therefore, each of the standard TAP controllers 500 and 600 decode instruction code for test (hereinafter referred to as instruction code) input from the TDI terminal 11 and outputs the instruction signal for test to the test target block while changing internal state according to the first internal TMS signal. Note that the first internal TMS signal is the signal that is changed while maintaining the logic level which is substantially the same as that of the TMS signal.

Figure 2:
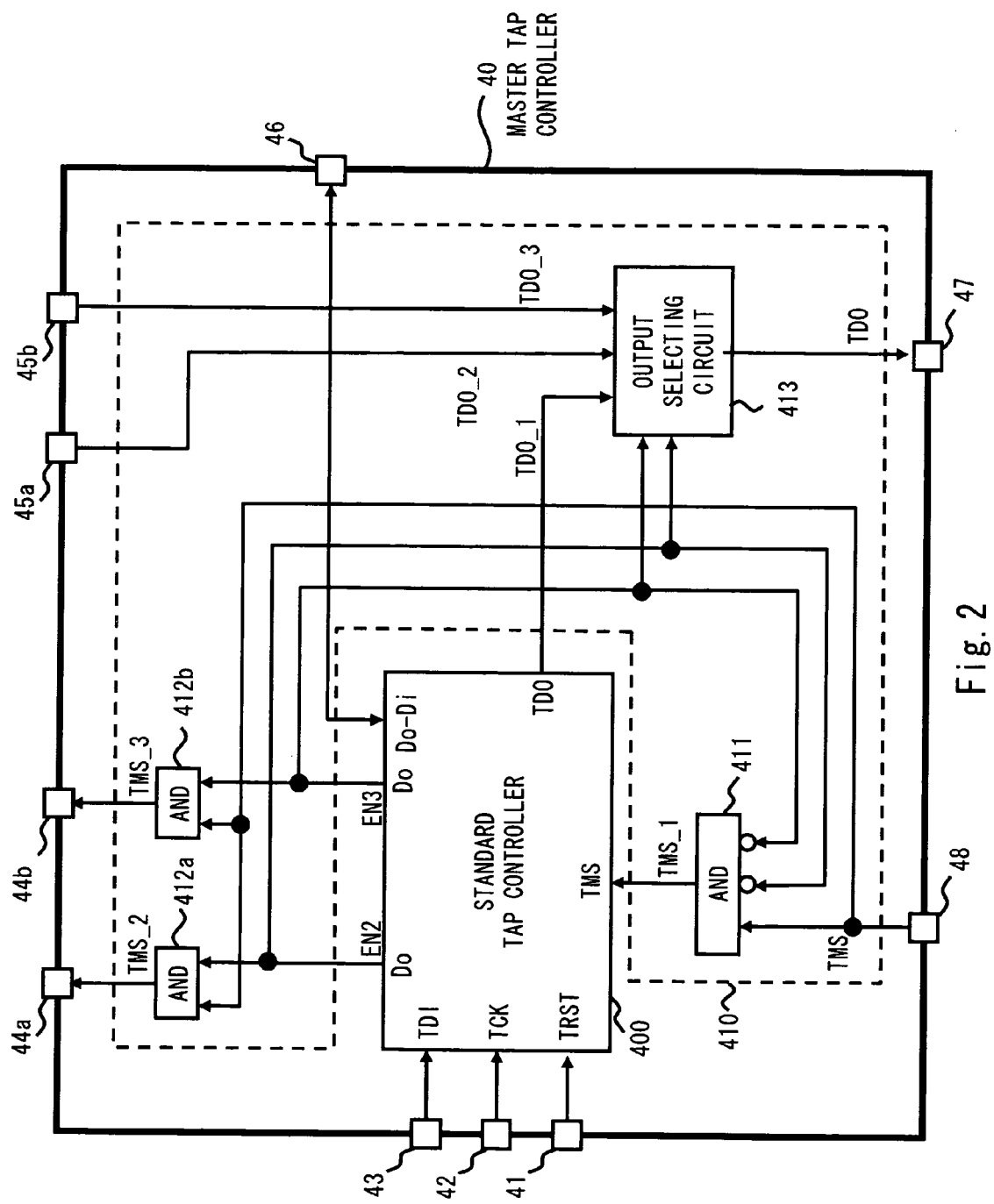
FIG. 2 is a block diagram of a master TAP controller according to the first embodiment.

Now, the master TAP controller 40 will be described in detail. FIG. 2 shows a block diagram of the master TAP controller 40. As shown in FIG. 2, the master TAP controller 40 includes a standard TAP controller 400 and a selecting circuit 410. The master TAP controller also includes input terminals 41 to 43, 45a, 45b, 48, and output terminals 44a, 44b, 47.

The standard TAP controller 400 performs operation complied with IEEE1149.1. The standard TAP controller 400 changes internal state based on first internal TMS signal TMS_1. The first internal TMS signal TMS_1 is output from the selecting circuit 410 described below. The standard TAP controller 400 outputs first selection signals EN2 and EN3 (hereinafter simply referred to as selection signals EN2 and EN3) separately from the instruction signal for test. The selection signals EN2 and EN3 are generated based on the instruction code for selection defined within a range allowed in IEEE1149.1. In the present embodiment, "101001" is defined as the instruction code for selection for generating the selection signal EN2 and "10001" is defined as the instruction code for selection for generating the selection signal EN3.

Note that the standard TAP controllers 400 to 600 are substantially the same circuit and include a plurality of signal output terminals Do, a data input terminal Di, a TDI terminal, a TCK terminal, a TRST terminal, a TMS terminal, and a TDO terminal. The plurality of signal output terminals Do are the output terminals of signal output from the standard TAP controller to the test target block or the selecting circuit. The data input terminal Di is the input terminal of the test result read out from the test target device. The standard TAP controller 400 employs two of the plurality of signal output terminals DO as the output terminals of selection signals EN2 and EN3. Although the number of data input terminal is considered to be one in the following description, a plurality of data input terminals may be provided.

The functions of the TDI terminal, the TCK terminal, the TRST terminal, the TMS terminal, and the TDO terminal provided in the standard TAP controller are substantially the same as the functions of the terminals used as the external terminals of the semiconductor device 1. The TDI terminal, the TCK terminal, the TRST terminal, the TMS terminal, and the TDO terminal provided in the standard TAP controller are hereinafter called separate test terminals in order to make a distinction between these terminals and the terminals used as the external terminals of the semiconductor device 1. Each of these separate test terminals is connected to each of the corresponding common test terminals, respectively.

The selecting circuit 410 generates the first internal TMS signal and selects a circuit to which the first internal TMS signal is output based on the selection signals EN2, EN3, and the TMS signal. The selecting circuit 410 includes AND gates 411, 412a, 412b, and an output selecting circuit 413. The AND gate 411 outputs logical AND of the TMS signal input from the input terminal 48, inversion signal of the selection signal EN2, and inversion signal of the selection signal EN3. The output of the AND gate 411 is the first internal TMS signal TMS_1 to the standard TAP controller 400. The AND gate 412a outputs logical AND of the TMS signal input from the input terminal 48 and the selection signal EN2. The output of the AND gate 412a is output from the output terminal 44a and becomes the first internal TMS signal TMS_2 to the standard TAP controller 500. The AND gate 412b outputs logical AND of the TMS signal input from the input terminal 48 and the selection signal EN3. The output of the AND gate 412b is output from the output terminal 44b and becomes the first internal TMS signal TMS_3 to the standard TAP controller 600.

The output selecting circuit 413 selects one of the output signal TDO_2 of the standard TAP controller 500 input from the input terminal 45a, the output signal TDO_3 of the standard TAP controller 600 input from the input terminal 45b, and the output signal TDO_1 of the standard TAP controller 400 based on the selection signals EN2 and EN3 and outputs the selected signal from the output terminal 47.

Now, the standard TAP controller and the test target block connected thereto will be described. Since each of the standard TAP controllers according to the present embodiment has substantially the same configuration, the standard TAP controller will be described by taking the standard TAP controller 500 as an example. Although the test target blocks include test target circuits where different functions are realized, the circuits for test included in the test target circuits are the same. The description of the test target circuit will be omitted since it is not essential part of the present invention and the circuit for test will be described. In the following description, the test target block 200 connected to the standard TAP controller 500 will be described.

Figure 3:
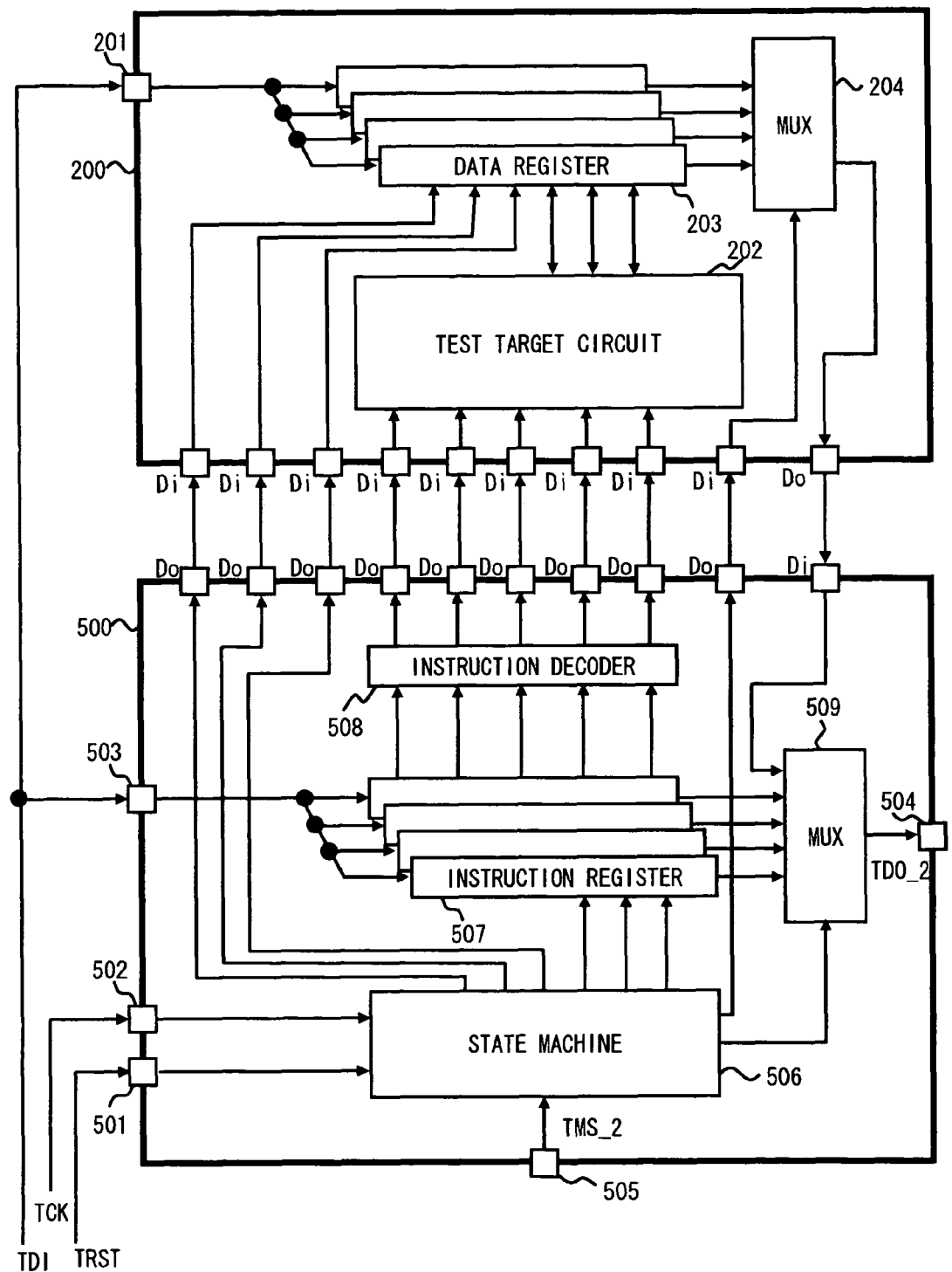
FIG. 3 is a block diagram of a standard TAP controller and a test target block according to the first embodiment.

FIG. 3 shows a block diagram of the standard TAP controller 500 and the test target block 200. As shown in FIG. 3, the standard TAP controller 500 includes a TRST terminal 501, a TCK terminal 502, a TDI terminal 503, a TDO terminal 504, and a TMS terminal 505 as the separate test terminals. The standard TAP controller 500 further includes a plurality of signal output terminals Do and a data input terminal Di. The standard TAP controller 500 includes a state machine 506, a plurality of instruction registers 507, an instruction decoder 508, and a multiplexer 509.

Figure 4:
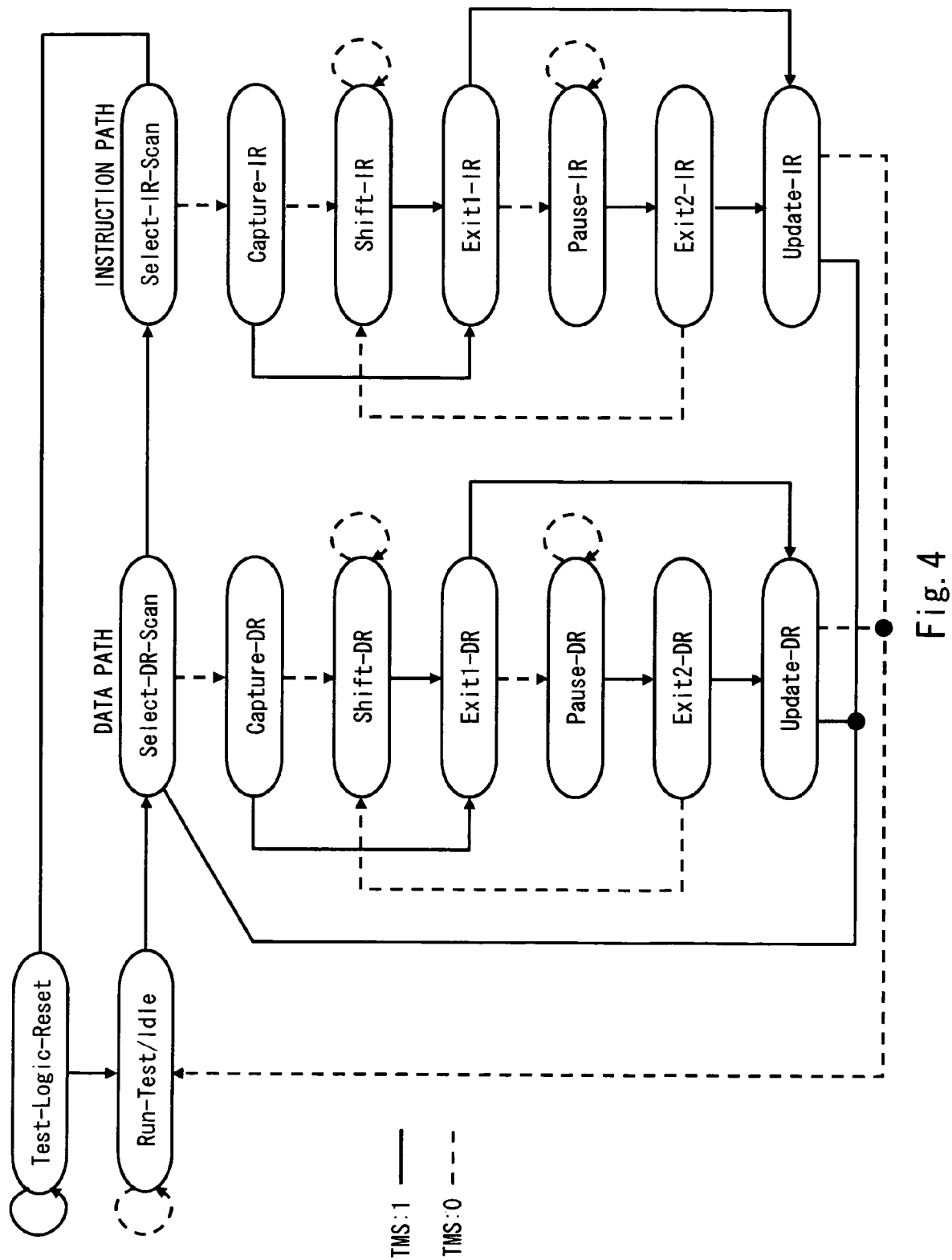
FIG. 4 is a state transition diagram of a state machine according to the first embodiment.

The state machine 506 changes the internal state according to the TMS signal input from the TMS terminal 505 and the clock signal TCK input from the TCK terminal 502 to change the output signal according to the state transition. FIG. 4 shows a state transition of the state machine 506. As shown in FIG. 4, the state machine 506 decides the transition state based on the value of the TMS signal. For example, if the value of the TMS signal is "1" when the state is Test-Logic-Reset, the state is kept even if the clock signal TCK is input. If the value of the TMS signal is "0", then the state is changed to Run-Test/Idle according to the input of the clock signal. Since the behavior of the state machine 506 is defined in IEEE1149.1, the description of the behaviors in each state will be omitted.

The plurality of instruction registers 507 store the instruction codes input from the TDI terminal 503. It is decided which of the instruction registers stores the instruction code when the state machine 506 is in Select-IR-Scan state. Further, the instruction code is stored when the state machine 506 is in Capture-IR state.

The instruction decoder 508 decodes instruction codes stored in the plurality of instruction registers 507. Then the decode result is output through the signal output terminals Do. In the standard TAP controller 400 of the master TAP controller 40, two of the decode results are selection signals EN2 and EN3. The instruction decoder 508 performs decode processing of the instruction codes when the state of the state machine 506 is in Update-IR.

The multiplexer 509 selects one of the data stored in the plurality of instruction registers 507 and the test result input to the data input terminal Di based on the state of the state machine 506 to output the selected result as the output signal TDO from the TDO terminal 504.

The test target block 200 includes a TDI terminal 201, a test target circuit 202, a plurality of data registers 203, and a multiplexer 204. The test target block 200 includes a plurality of data input terminals Di and a signal output terminal Do. The test target block 200 receives the output signals of the standard TAP controller 500 by the data input terminals Di and transmits the test result to the standard TAP controller 500 through the signal output terminal Do. The test target circuit 202 of the test target block 200 behaves based on the decode result of the instruction decoder 508 of the standard TAP controller 500. The plurality of data registers 203 and the multiplexer 204 of the test target block 200 behave based on the state of the state machine 506 of the standard TAP controller 500.

The TDI terminal 201 is connected to the TDI terminal 11 of the common test terminal and instruction code is input to the TDI terminal 201. The test target circuit 202 is the test target circuit. The plurality of data registers 203 store data for test input from the TDI terminal 201. It is decided which of the data registers stores the data for test when the state machine 506 is in Select-DR-Scan state. The data for test is stored when the state machine 506 is in Capture-DR state. The data for test is the input data to the test target circuit 202 used for test of the test target circuit 202. This data for test is input to the test target circuit 202 when the state machine 506 is in Update-DR state. The plurality of data registers 203 store the test result of the test target circuit 202.

The multiplexer 204 selects one of the data stored in the plurality of data registers 203 based on the state of the state machine 506 to output the selected data as the output signal of the test target block from the signal output terminal Do.

Now, the behavior of the semiconductor device 1 according to the present embodiment will be described. The test method employing the standard TAP controller corresponds to the behavior complied with IEEE1149.1. Therefore, the description of the behavior regarding the test employing the standard TAP controller is omitted here. The behavior of controlling the standard TAP controllers 500 and 600 employing the master TAP controller 40 will hereinafter be described.

In the present embodiment, the master TAP controller 40 uses the instruction code for selection for controlling the standard TAP controllers 500, 600. The instruction code for selection is the instruction code that is defined in a range allowed by IEEE1149.1. The instruction code for selection is transmitted to the standard TAP controller 400 in the master TAP controller 40 from the TDI terminal 11. The standard TAP controller 400 stores the instruction code for selection in the instruction register 507 and decodes the instruction code for selection by the instruction decoder so as to make one of the selection signals EN2 and EN3 high level ("1" for example).

In the present invention, "01001" is defined as the instruction code for selection making the selection signal EN2 high level, and "10001" is defined as the instruction code for selection making the selection signal EN3 high level. Both of the selection signals EN2 and EN3 are in low level ("0" for example) in an initial state.

Since both of the selection signals EN2 and EN3 are in low level in the initial state, the AND gate 411 of the selecting circuit 410 outputs the TMS signal input through the TMS terminal 14 and the input terminal 48 as the first internal TMS signal TMS_1. Therefore, the first internal TMS signal TMS_1 changes while maintaining the logic level that is substantially the same as that of the TMS signal. The first internal TMS signal TMS_1 is input to the standard TAP controller 400 in the master TAP controller 40.

On the other hand, since both of the selection signals EN2 and EN3 are in low level, AND gates 412a, 412b of the selecting circuit 410 block the TMS signal input through the TMS terminal 14 and the input terminal 48. Therefore, the first internal TMS signals TMS_2 and TMS_3 maintain low level.

Therefore, the standard TAP controller 400 in the master TAP controller 40 operates the state machine based on the change of the TMS signal until the instruction code for selection is input (which means the state machine performs behavior complied with IEEE1149.1). On the other hand, since the first internal TMS signals TMS_2 and TMS_3 maintain low level, the standard TAP controllers 500 and 600 maintain the state of the state machine in the state of Test-Logic-Reset. In this case, the output selecting circuit 413 selects the output signal TDO_1 output from the standard TAP controller 400 and outputs the output signal TDO_1 through the output terminal 47 and the TDO terminal 15.

Now, the description will be made on a case where "01001" is input as the instruction code for selection. In this case, the selection signal EN2 is in high level and the selection signal EN3 is in low level. Based on the state of the selection signal, the AND gate 411 and the AND gate 412b block the TMS signals input through the TMS terminal 14 and the input terminal 48 and make the first internal TMS signal TMS_1 and the first internal TMS signal TMS_3 low level. On the other hand, the AND gate 412a outputs the TMS signals input through the TMS terminal 14 and the input terminal 48 as the first internal TMS signal TMS_2. Hence, the first internal TMS signal TMS_3 changes while maintaining the logic level substantially the same as that of the TMS signals input through the TMS terminal 14 and the input terminal 48.

Therefore, the first internal TMS signal TMS_1 input to the standard TAP controller 400 in the master TAP controller 40 and the first internal TMS signal TMS_3 input to the standard TAP controller 600 are in low level and do not change. Therefore, the standard TAP controllers 400 and 600 maintain the state of the state machine in the state of Test-Logic-Reset. On the other hand, the first internal TMS signal TMS_2 to the standard TAP controller 500 operates the state machine based on the change of the TMS signal input through the TMS terminal 14 and the input terminal 48 (which means the state machine performs the operation complied with IEEE1149.1). In this case, the output selecting circuit 413 selects the output signal TDO_2 output from the standard TAP controller 500 and outputs the output signal TDO_2 through the output terminal 47 and the TDO terminal 15.

Now, the description will be made on a case where "10001" is input as the instruction code for selection. In this case, the selection signal EN3 is in high level and the selection signal EN2 is in low level. Based on the state of the selection signal, the AND gate 411 and the AND gate 412*a* block the TMS signals input through the TMS terminal 14 and the input terminal 48 and make the first internal TMS signal TMS_1 and the first internal TMS signal TMS_2 low level. On the other hand, the AND gate 412*b* outputs the TMS signals input through the TMS terminal 14 and the input terminal 48 as the first internal TMS signal TMS_3. Hence, the first internal TMS signal TMS_3 changes while maintaining the logic level substantially the same as that of the TMS signals input through the TMS terminal 14 and the input terminal 48.

Therefore, the first internal TMS signal TMS_1 input to the standard TAP controller 400 in the master TAP controller 40 and the first internal TMS signal TMS_2 input to the standard TAP controller 500 are in low level and do not change. Therefore, the standard TAP controllers 400 and 500 maintain the state of the state machine in the state of Test-Logic-Reset. On the other hand, the first internal TMS signal TMS_3 to the standard TAP controller 600 operates the state machine based on the change of the TMS signal input through the TMS terminal 14 and the input terminal 48 (which means the state machine performs the operation complied with IEEE1149.1). In this case, the output selecting circuit 413 selects the output signal TDO_3 output from the standard TAP controller 600 and outputs the output signal TDO_3 through the output terminal 47 and the TDO terminal 15.

From the above description, the test circuit according to the present invention includes the standard TAP controller 400 and the selecting circuit. In the standard TAP controller 400, the master TAP controller 40 is able to output the selection signal based on the instruction code for selection. The selecting circuit selects the circuit to which the TMS signal input through the TMS terminal 14 and the input terminal 48 is output based on the selection signal.

This makes it possible for the test circuit to select the standard TAP controller that is to be operated from among the plurality of standard TAP controllers based on the instruction code for selection and to use the selected standard TAP controller in the operation complied with IEEE1149.1. Further, the instruction code for selection according to the present embodiment does not violate the specification of IEEE1149.1. Therefore, even when the instruction code for selection is added, the test circuit of the present embodiment does not violate the specification of IEEE1149.1 and it is possible to control the plurality of standard TAP controllers by the operation complied with IEEE1149.1. Therefore, it is possible to operate the semiconductor device 1 including the test circuit of the present invention without introducing incompatibility with other semiconductor devices in the specification of IEEE1149.1 even when the semiconductor device 1 is mounted on the substrate with other semiconductor devices.

Further, in the present embodiment, the semiconductor device 1 only includes a set of common test terminals, and other terminals do not need to be added in order to control the plurality of standard TAP controllers. Therefore, it is possible to control the plurality of standard TAP controllers by minimum number of terminals.

Second Embodiment

Figure 5:
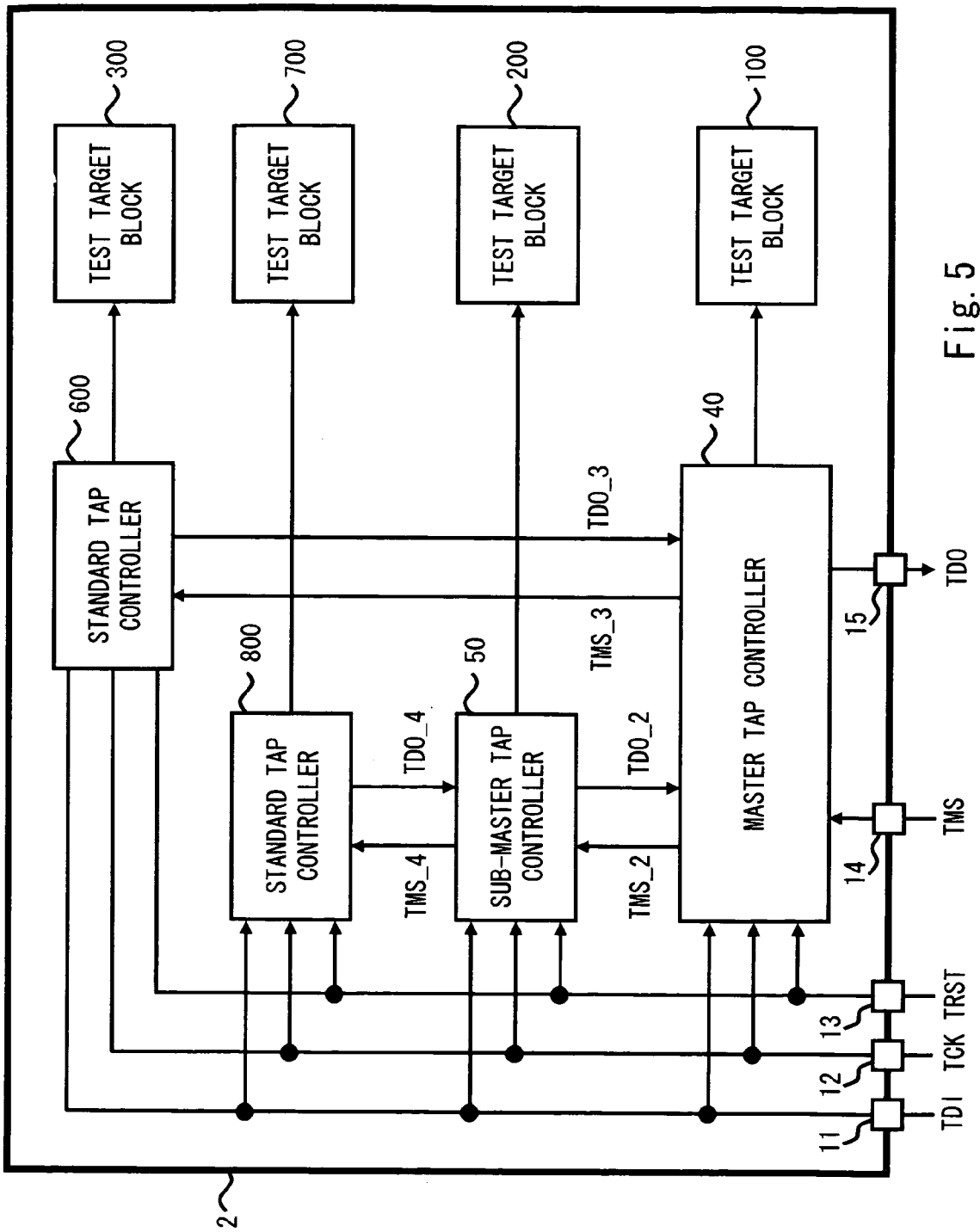
FIG. 5 shows a semiconductor device according to a second embodiment.

FIG. 5 shows a block diagram of a semiconductor device 2 according to the second embodiment. As shown in FIG. 5, the test circuit according to the second embodiment includes a third controller (a sub-master TAP controller, for example) 50 in addition to the master TAP controller 40. The sub-master TAP controller 50 outputs the second internal TMS signal TMS_4 to a standard TAP controller 800 based on the first internal TMS signal TMS_2 output from the master TAP controller and the instruction code for selection. Note that the sub-master TAP controller 50 includes a third TAP controller including a function of decoding the instruction code for selection. In the present embodiment, the standard TAP controller 500 embedded in the sub-master TAP controller 50 corresponds to the third TAP controller.

Figure 6:
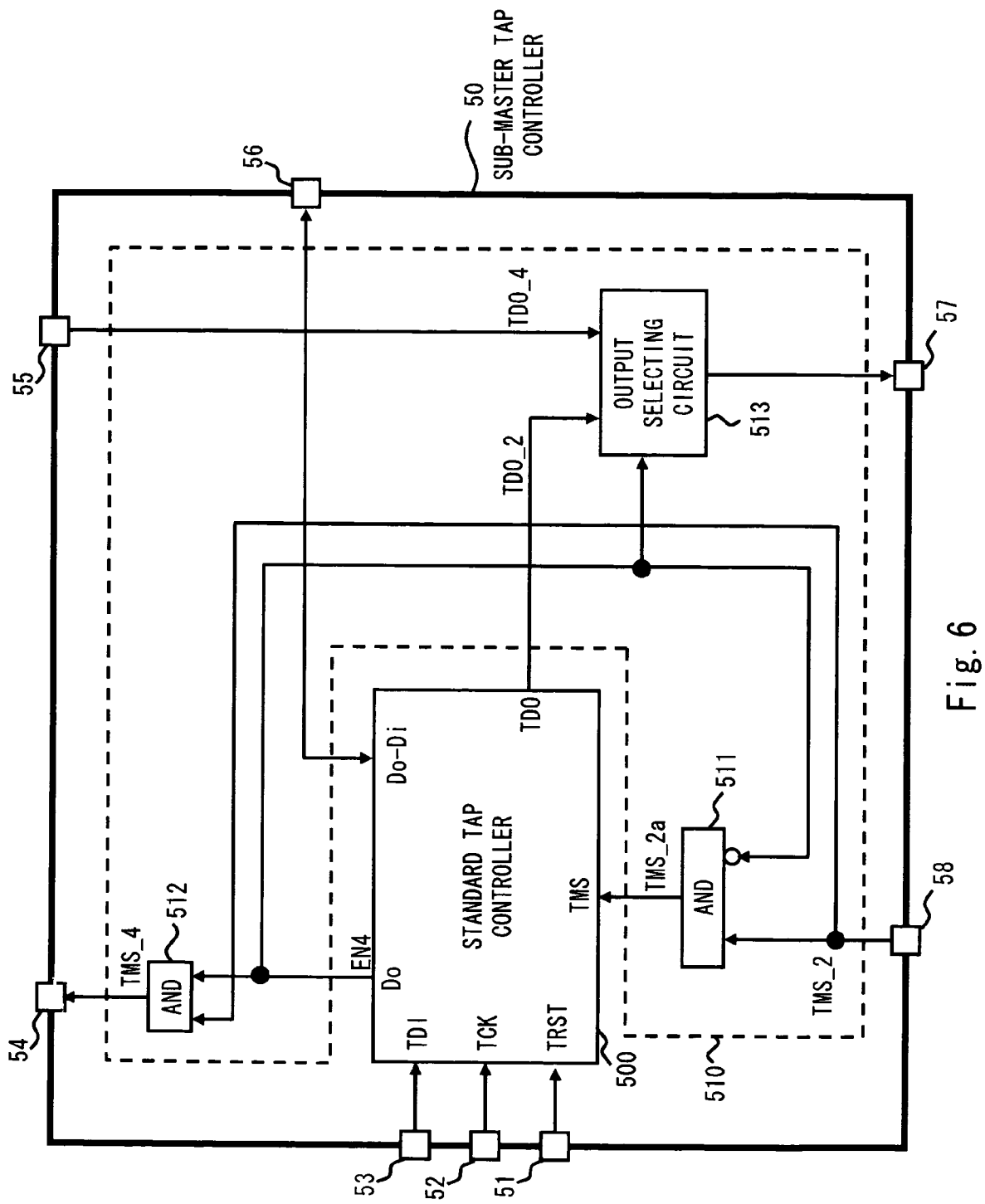
FIG. 6 is a block diagram of a sub-master TAP controller according to the second embodiment.

FIG. 6 shows a block diagram of the sub-master TAP controller. As shown in FIG. 6, the sub-master controller includes a standard TAP controller 500 and a selecting circuit 510. In the standard TAP controller 500 in the second embodiment, a function of outputting the second selection signal EN4 (hereinafter simply referred to as selection signal EN4) as the output signal is added to the standard TAP controller 500 of the first embodiment. Note that the selection signal EN4 is output as one signal of the plurality of output signals. "00100" is used, for example, as the instruction code for selection for outputting the selection signal EN4.

In the selecting circuit 510, the number of TMS signals that can be selected is deleted from the selecting circuit 410 according to the first embodiment. The selecting circuit 510 includes AND gates 511, 512, and the output selecting circuit 513. The AND gate 511 outputs logical AND of the first TMS signal TMS_2 input from the input terminal 58 and the inversion signal of the selection signal EN4. The output of the AND gate 511 is the second internal TMS signal TMS_2*a* to the standard TAP controller 500. The AND gate 512 outputs logical AND of the first TMS signal TMS_2 input from the input terminal 58 and the selection signal EN4. The output of the AND gate 512 is output from the output terminal 54 and this output is the second internal TMS signal TMS_4 to the standard TAP controller 800.

The output selecting circuit 513 selects one of the output signal TDO_4 of the standard TAP controller 800 input from the input terminal 55 and the output signal TDO_2 of the standard TAP controller 500 based on the selection signal EN4 to output the selected signal from the output terminal 57.

From the above description, in the test circuit according to the second embodiment, it is possible to control other standard TAP controllers even in the TAP controller dependently connected to the master TAP controller. A plurality of sub-master TAP controllers may be provided. It is possible to further improve controllability of the TAP controller in the test circuit by providing this sub-master TAP controller.

Third Embodiment

Figure 7:
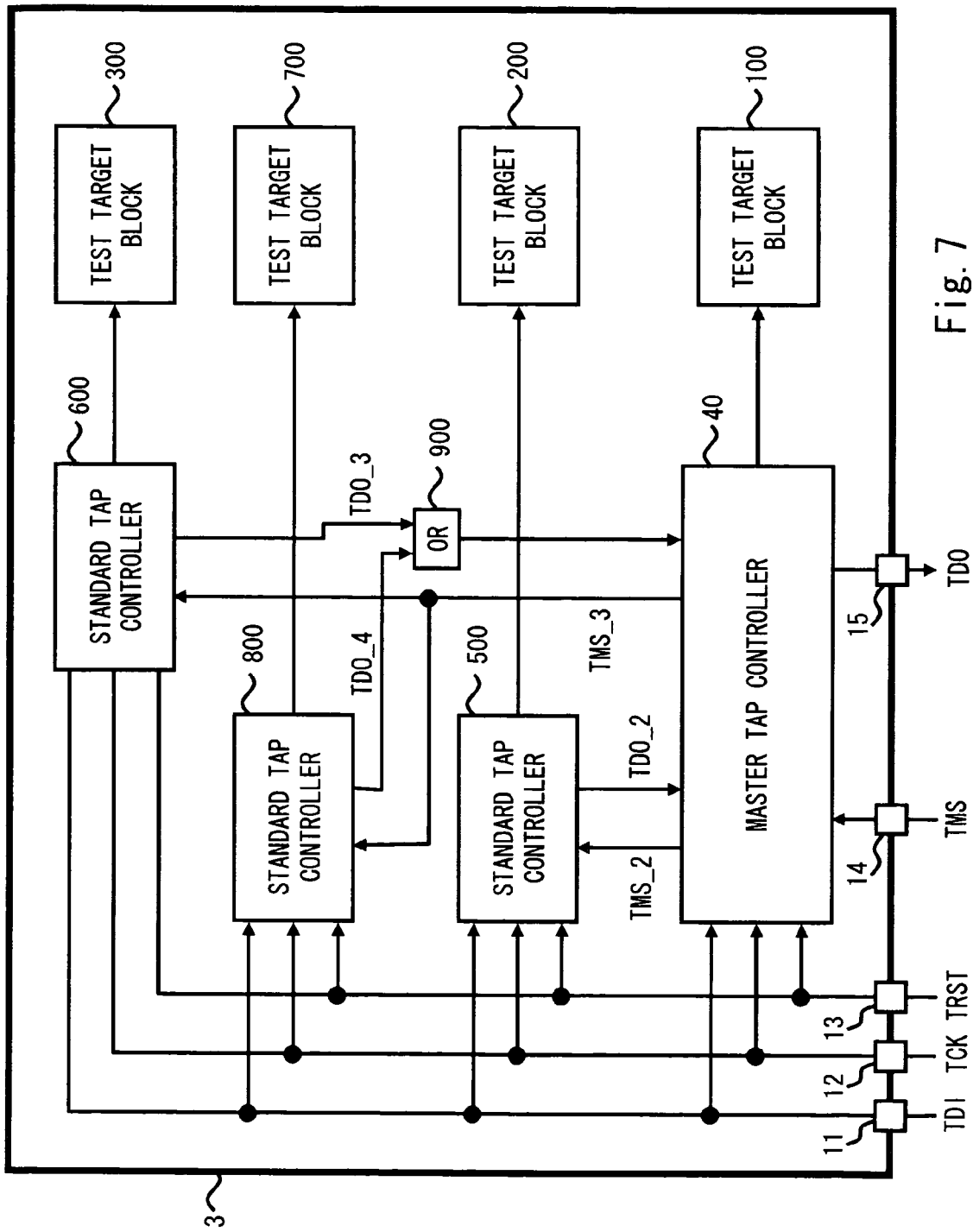
FIG. 7 is a block diagram of a semiconductor device according to a third embodiment.

FIG. 7 shows a block diagram of a semiconductor device 3 according to the third embodiment. As shown in FIG. 7, in the test circuit according to the third embodiment, the first internal TMS signal TMS_3 is input to the two standard TAP controllers of the standard TAP controllers 600 and 800. In this case, since only up to three output signals TDO can be selected in the master TAP controller 40, arbitration is performed on the output signal TDO_3 and the output signal TDO_4 using an OR gate 900 as an arbitration circuit.

As stated above, it is possible to input the first internal TMS signal to the plurality of standard TAP controllers by performing arbitration on the output signal TDO by the arbitration circuit.

Fourth Embodiment

Figure 8:
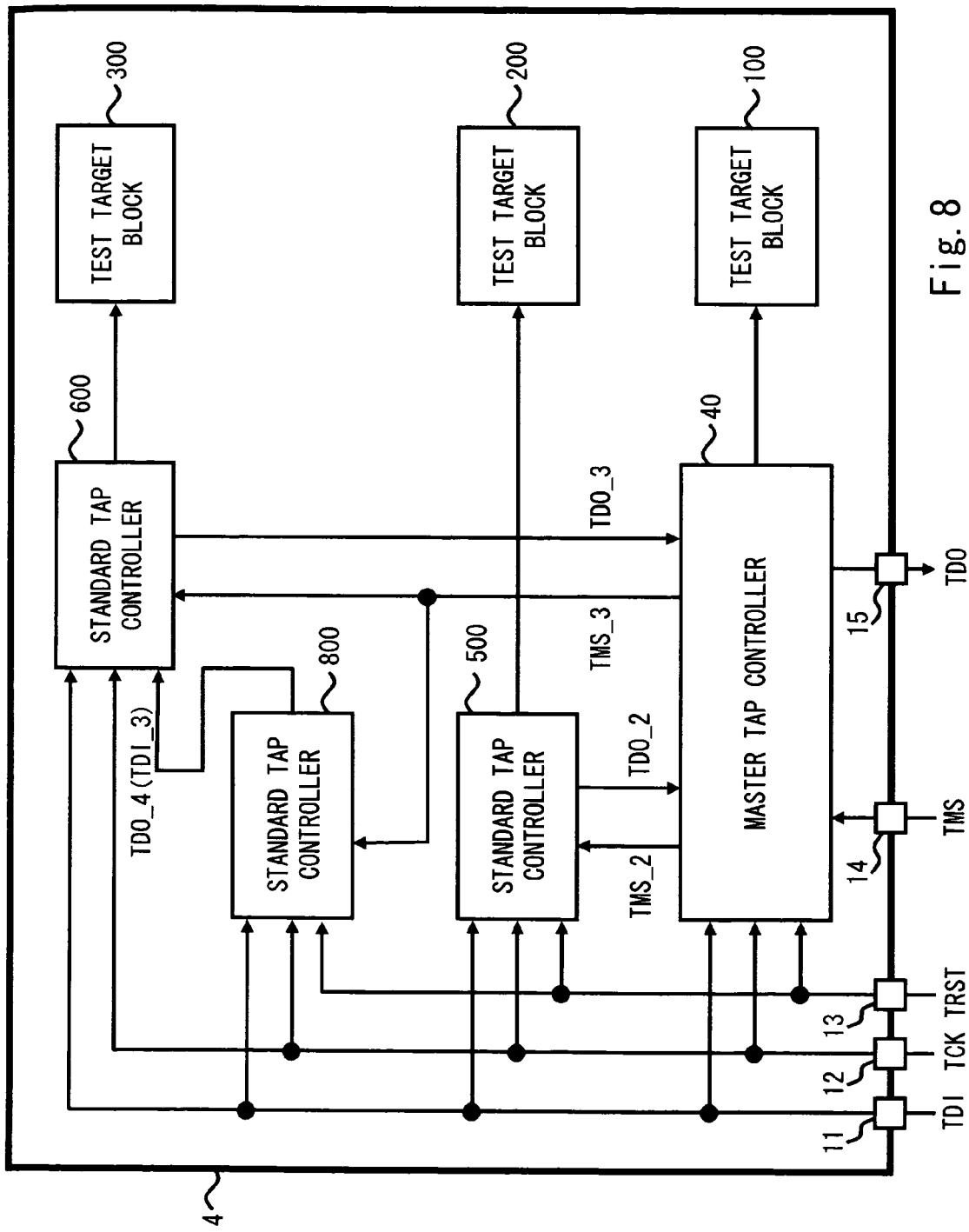
FIG. 8 is a block diagram of a semiconductor device according to a fourth embodiment.

FIG. 8 shows a block diagram of a semiconductor device 4 according to the fourth embodiment. As shown in FIG. 8, in the test circuit according to the fourth embodiment, the first internal TMS signal TMS_3 is input to two standard TAP controllers of the fourth TAP controller (standard TAP controller 600, for example) and the second controller (standard TAP controller 800, for example) and the output signal of the standard TAP controller 800 is made instruction code of the standard TAP controller 600. Hence, it is possible to achieve the effect of the present invention even when the standard TAP controllers are dependently connected with respect to the instruction code.

Fifth Embodiment

Figure 9:
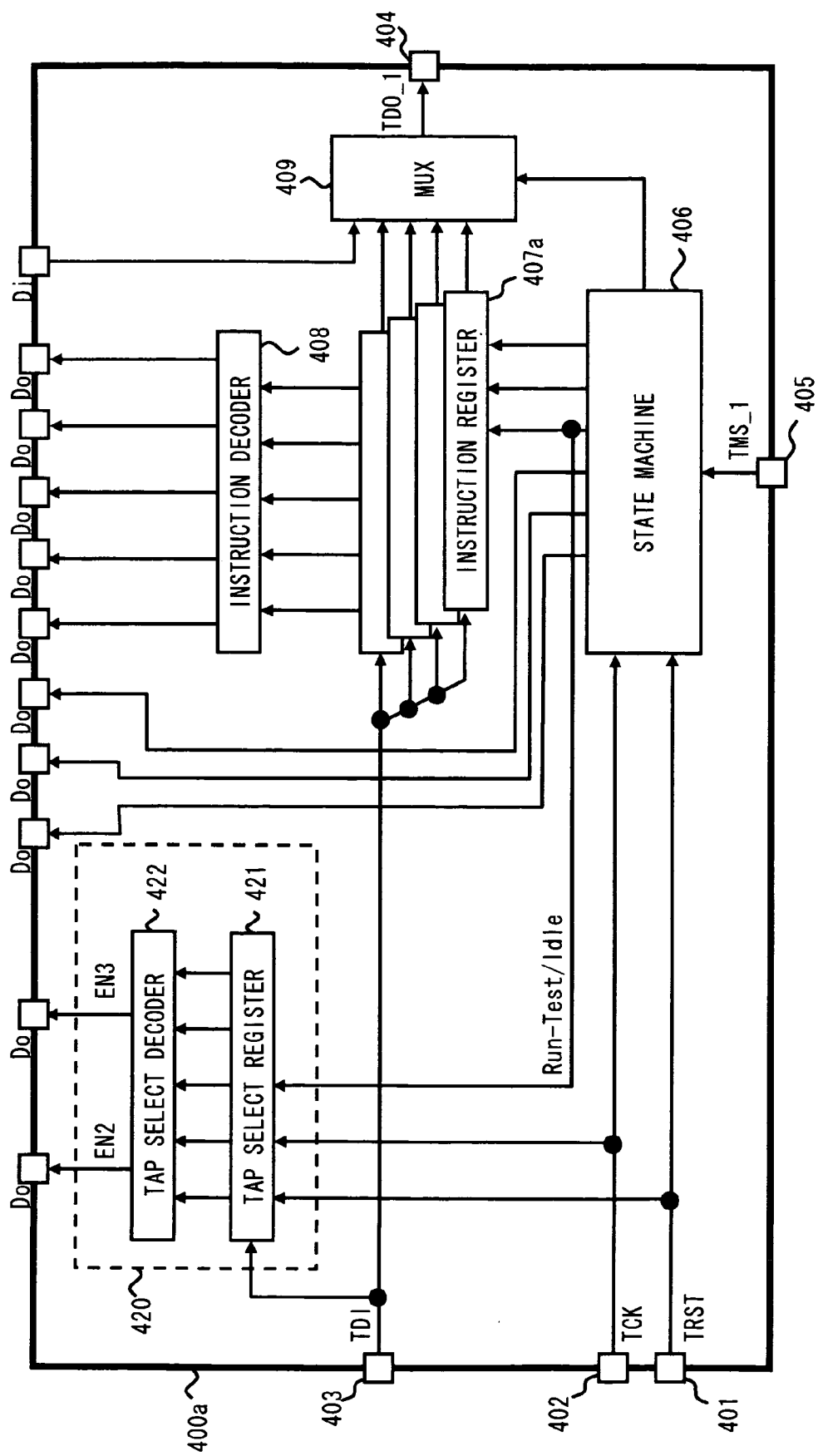
FIG. 9 is a block diagram of a master TAP controller according to a fifth embodiment.

FIG. 9 shows a block diagram of a standard TAP controller 400a according to the fifth embodiment. The standard TAP controller 400a is used in place of the standard TAP controller 400 according to the first embodiment. As shown in FIG. 9, in the standard TAP controller 400a, a selection signal generating circuit 420 is added to the standard TAP controller 400.

The selection signal generating circuit 420 includes a TAP select register 421 and a TAP select decoder 422. The TAP select register 421 stores the instruction code for selection. The TAP select decoder 422 decodes the instruction code for selection stored in the TAP select register 421 to output the selection signals EN2 and EN3. Note that the instruction code for selection is input to the TAP select register 421 from the TDI terminal 403, the clock signal is input from the TCK terminal 402, a reset signal is input from the TRST terminal, and the signal indicating that the state machine 406 is Run-Test/Idle is input from the state machine 406.

Figure 10:
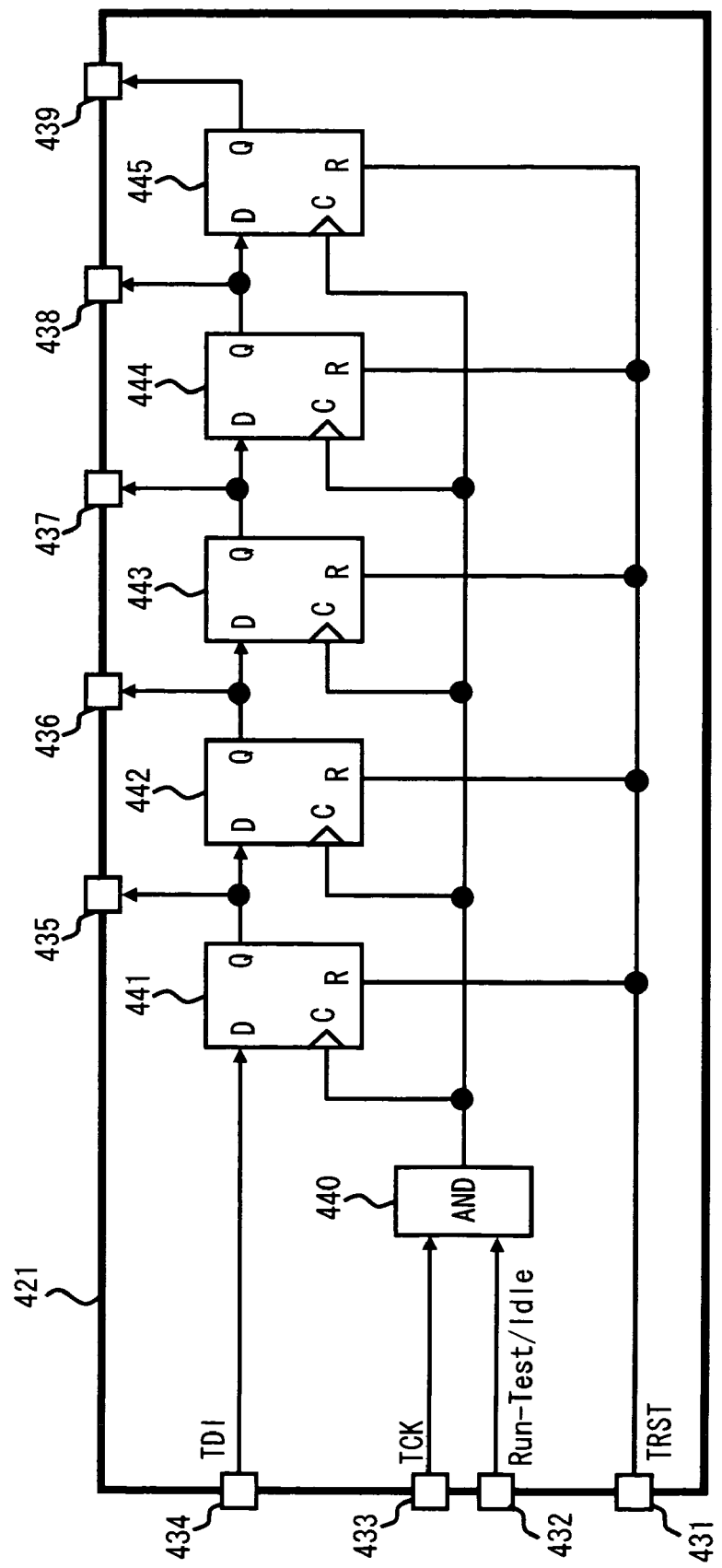
FIG. 10 is a block diagram of a TAP select register in the master TAP controller according to the fifth embodiment.

FIG. 10 shows a block diagram of the TAP select register 421 and the behavior of the TAP select register 421 will be described. As shown in FIG. 10, the TAP select register 421 includes an AND gate 440 and D flip flops 441 to 445. The AND gate 440 outputs the clock signal to the D flip flops 441 to 445 when the signal indicating that the state machine 406 is Run-Test/Idle is in high level. On the other hand, the AND gate 440 stops the output of the clock signal to the D flip flops 441 to 445 when the signal indicating that the state machine 406 is Run-Test/Idle is in low level.

The D flip flops 441 to 445 form shift register configuration where each of the D flip flops 441 to 445 is connected in serial. This shift register stores the data of the instruction code for selection while shifting the data in accordance with rising of the clock signal. The D flip flops 441 to 445 make the output low level when the reset signal is in high level. The output of each of the D flip flops 441 to 445 is connected to the TAP select decoder 422 through each of the output terminals 435 to 439, respectively.

From above configuration, the selection signal generating circuit 420 performs input and decode of the instruction code for selection when the state machine 406 is in Run-Test/Idle state. Even when the selection signal generating circuit 420 is added to the standard TAP controller 400, behavior of the standard TAP controller 400a regarding IEEE1149.1 by no means violate the specification. Therefore, it is possible to add the function of outputting the selection signal to the standard TAP controller by adding the selection signal generating circuit 420 to the standard TAP controller. Therefore, the standard TAP controller according to the present invention can easily be designed by preparing the selection signal generating circuit 420 in advance.

Sixth Embodiment

The sixth embodiment shows a variation example of the master TAP controller in the semiconductor device 1 of the first embodiment. In the fourth embodiment, the example of selecting the two standard TAP controllers by inputting the first internal TMS signal TMS_3 output from the master TAP controller 40 to the standard TAP controllers 600 and 800 is shown. In the sixth embodiment, a variation example of the master TAP controller 40 is shown. In the master TAP controller 40a in the sixth embodiment, the plurality of TAP controllers are selected by changing the configurations of the instruction code for selection added to the embedded standard TAP controller 400 and the selecting circuit without simultaneously providing one internal TMS signal for the plurality of standard TAP controllers. In the fourth embodiment, the outputs of the plurality of standard controllers are made one output signal by providing the OR circuit separately from the TAP controller. However, the sixth embodiment includes an output selecting circuit that can select any output signal. The master TAP controller 40a in the sixth embodiment will be described hereinafter in detail.

Figure 11:
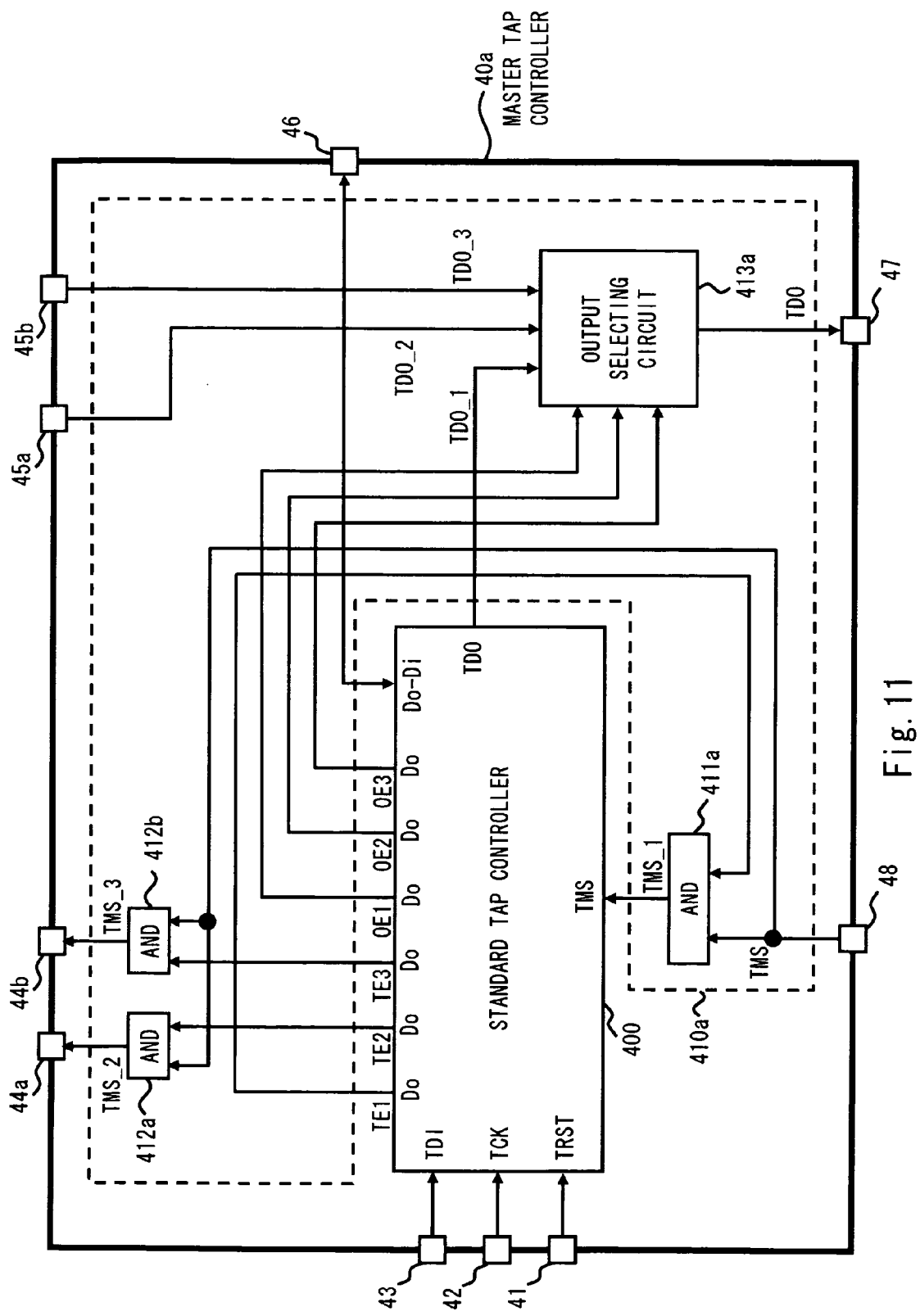
FIG. 11 is a block diagram of a master TAP controller according to a sixth embodiment.

FIG. 11 shows a block diagram of the master TAP controller 40a according to the sixth embodiment. The master TAP controller 40a includes the standard TAP controller 400 and the selecting circuit 410a. Although the standard TAP controller 400 is the same as the one used in the above embodiments, the standard TAP controller 400 uses six of the plurality of output signals Do as the selection signals according to the change of the configuration of the instruction code for selection that is provided. Further, three first selection signals (selection signals TE1 to TE3, for example) from among six selection signals are used to select the first internal TMS signal, and rest of the three first selection signals are used to select the output signal TDO as the third selection signals (selection signals OE1 to OE3, for example). Even in this embodiment, the instruction code for selection input to the standard TAP controller 400 is defined within a range allowed in IEEE1149.1. The detail of the instruction code for selection used in the present embodiment will be hereinafter described in detail.

The selecting circuit 410a includes AND gates 411a, 412a, 412b, and the output selecting circuit 413a. The TMS signal TMS is input to one input terminal of the AND gate 411a through the input terminal 48, and the selection signal TE1 output from the standard TAP controller 400 is input to the other input terminal of the AND gate 411a. The AND gate 411a then outputs the logical AND of the input signals as the first internal TMS signal TMS_1. The selection signal TE2 is input to one input terminal of the AND gate 412a and the TMS signal input through the input terminal 48 is input to the other input terminal of the AND gate 412a. The AND gate 412a outputs the logical AND of the input signals as the first internal TMS signal TMS_2. The selection signal TE3 is input to one input terminal of the AND gate 412b, and the TMS signal input through the input terminal 48 is input to the other input terminal of the AND gate 412b. The AND gate 412b then outputs the logical AND of the input signals as the first internal TMS signal TMS_3.

The output selecting circuit 413a selects one of the output signals TDO_1 to TDO_3 based on the values of the selection signals OE1 to OE3 to output the selected signal to the output terminal 47 as final output signal TDO. Now, FIG. 12 shows an example of a truth table of the output selecting circuit 413a. As shown in FIG. 12, the output selecting circuit 413a outputs the output signal TDO_1 as the final output signal TDO if the logic value of the selection signal OE1 is "1", outputs the output signal TDO_2 as the final output signal TDO if the logic value of the selection signal OE2 is "1", and outputs the output signal TDO_3 as the final output signal TDO if the logic value of the selection signal OE3 is "1". Note that the state where the logic value is "1" is called an active state of the selection signal in the following description.

Now, the instruction code for selection in the sixth embodiment will be described. FIG. 13 shows an example of the instruction code for selection used in the sixth embodiment. As shown in FIG. 13, the sixth embodiment uses the instruction code having 5-bit instruction length. In the example shown in FIG. 13, if the left side value of the instruction code for selection is made upper bit, upper 2 bits of the instruction code for selection are defined as the value controlling the active state of the selection signals OE1 to OE3 and lower 3 bits are defined as the value controlling the active state of the selection signals TE1 to TE3.

In the example shown in FIG. 13, if the values of the upper 2 bits are "01", the selection signal OE1 is in active. If the values are "10", the selection signal OE2 is in active. If the values are "11", the selection signal OE3 is in active. If the highest bit of the lower 3 bits is "1", then the selection signal TE1 is in active. If the middle number of the lower 3 bits is "1", the selection signal TE2 is in active. If the lowest bit of the lower 3 bits is "1", the selection signal TE3 is in active. In the instruction code for selection shown in FIG. 13, "00101" where the selection signals TE1 and OE1 are active becomes the reset initial value. This reset initial value may be set to other instruction code for selection. For example, "01110" where the selection signals TE1, TE2, and OE2 are in active can be set as reset initial value as shown in FIG. 14.

By defining the instruction code for selection as above, the selection signals TE1, TE2, and OE2 are in active state if the instruction code for selection is "01110", for example. Therefore, the master TAP controller 40a and the standard TAP controller 500 are in active and the master TAP controller 40a outputs the output signal TDO_2 output from the standard TAP controller 500 as the final output signal.

In the test circuit according to the sixth embodiment, it is possible to make the plurality of first internal TMS signals active state by changing the configuration of the instruction code for selection. The output selecting circuit 413a is formed so as to be able to select one of the plurality of output signals TDO_1 to TDO_3 in accordance with the values of the selection signals OE1 to OE3. Hence, the test circuit according to the sixth embodiment is able to perform tests on the test target circuits simultaneously by the plurality of standard TAP controllers and to arbitrarily select an output of any one standard TAP controller. Therefore, the test circuit according to the sixth embodiment makes the plurality of standard TAP controllers active by the definition of the instruction code for selection and it is possible to perform test having higher flexibility than the embodiments above.

Seventh Embodiment

Figure 15:
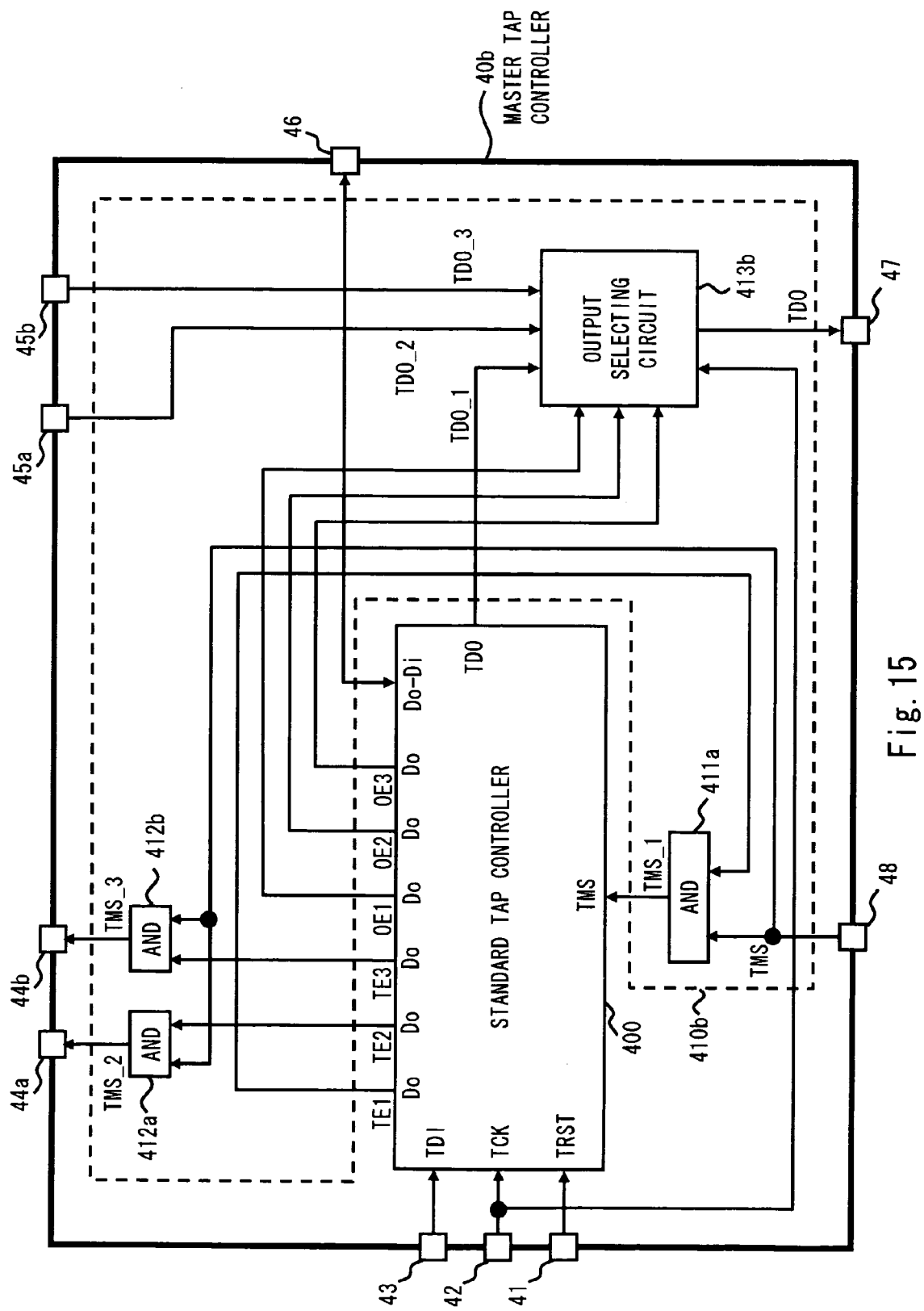
FIG. 15 is a block diagram of a master TAP controller according to a seventh embodiment.

In the sixth embodiment, the output selecting circuit 413a selects one of the three output signals. In the seventh embodiment, an output selecting circuit 413b is able to select two output signals of the three output signals. FIG. 15 shows a block diagram of the master TAP controller 40b including the output selecting circuit 413b. In FIG. 15, the selecting circuit including the output selecting circuit 413b is called selecting circuit 410b.

FIG. 16 shows a truth table of the output selecting circuit 413b. As shown in FIG. 15, clock signal TCK is input to the output select circuit 413b in addition to the selection signals OE1 to OE3 and the output signals TDO_1 to TDO_3. As shown in the truth table in FIG. 16, if two selection signals of the three selection signals are in active state, the output selecting circuit 413b switches the output signal output in accordance with the logic value of the clock signal TCK. In the example shown in FIG. 16, if one of the selection signals OE1 to OE3 is in active state, the output selecting circuit 413b selects one output signal in accordance with the selection signal. On the other hand, if two selection signals of the selection signals OE1 to OE3 are in active state, the output signal having smaller number of the output signals that are selected and designated is selected when the logic value of the clock signal is "0" and the output signal having larger number of the output signals that are selected and designated is selected when the logic value of the clock signal is "1". For example, if the selection signals OE1 and OE2 are in active state, the output signal TDO_1 is selected when the logic value of the clock signal is "1" and the output signal TDO_2 is selected when the logic value of the clock signal is "0".

Further, in order to make two selection signals of the selection signals OE1 to OE3 active, the instruction code having 6-bit instruction length is used as the instruction code for selection in the seventh embodiment. FIG. 17 shows an example of the instruction code for selection used in the seventh embodiment. In the example shown in FIG. 17, if the left side value of the instruction code for selection is made upper bit, the upper 3 bits of the instruction code for selection are defined as the value controlling the active state of the selection signals OE1 to OE3 and the lower 3 bits of the instruction code for selection are defined as the value controlling the active state of the selection signals TE1 to TE3.

In the example shown in FIG. 17, if the highest bit of the upper 3 bits is "1", then the selection signal OE1 is in active state. If the middle number of the upper 3 bits is "1", the selection signal OE2 is in active. If the lowest bit of the upper 3 bits is "1", the selection signal OE3 is in active state. If the highest bit of the lower 3 bits is "1", the selection signal TE1 is in active state. If middle number of the lower 3 bits is "1", the selection signal TE2 is in active state. If the lowest bit of the lower 3 bits is "1", the selection signal TE3 is in active state. In the instruction code for selection shown in FIG. 17, "001001" where the selection signals TE1 and OE1 are active state becomes the reset initial value.

In the sixth embodiment, only one of the selection signals OE1 to OE3 can be made active. However, in the seventh embodiment, two of the selection signals OE1 to OE3 can be made active by defining the instruction code for selection as above. For example, if the instruction code for selection is "011011", then the selection signals TE1, TE2, OE1, and OE2 can be made active.

From above description, the test circuit according to the seventh embodiment is able to make the two standard TAP controllers active simultaneously and each output signal of the activated standard TAP controllers can be taken out alternately according to the value of the clock signal. Therefore, it is possible for the test circuit according to the seventh embodiment to perform the test with higher flexibility and to realize higher observability of the test result than the embodiments above.

Eighth Embodiment

Figure 18:
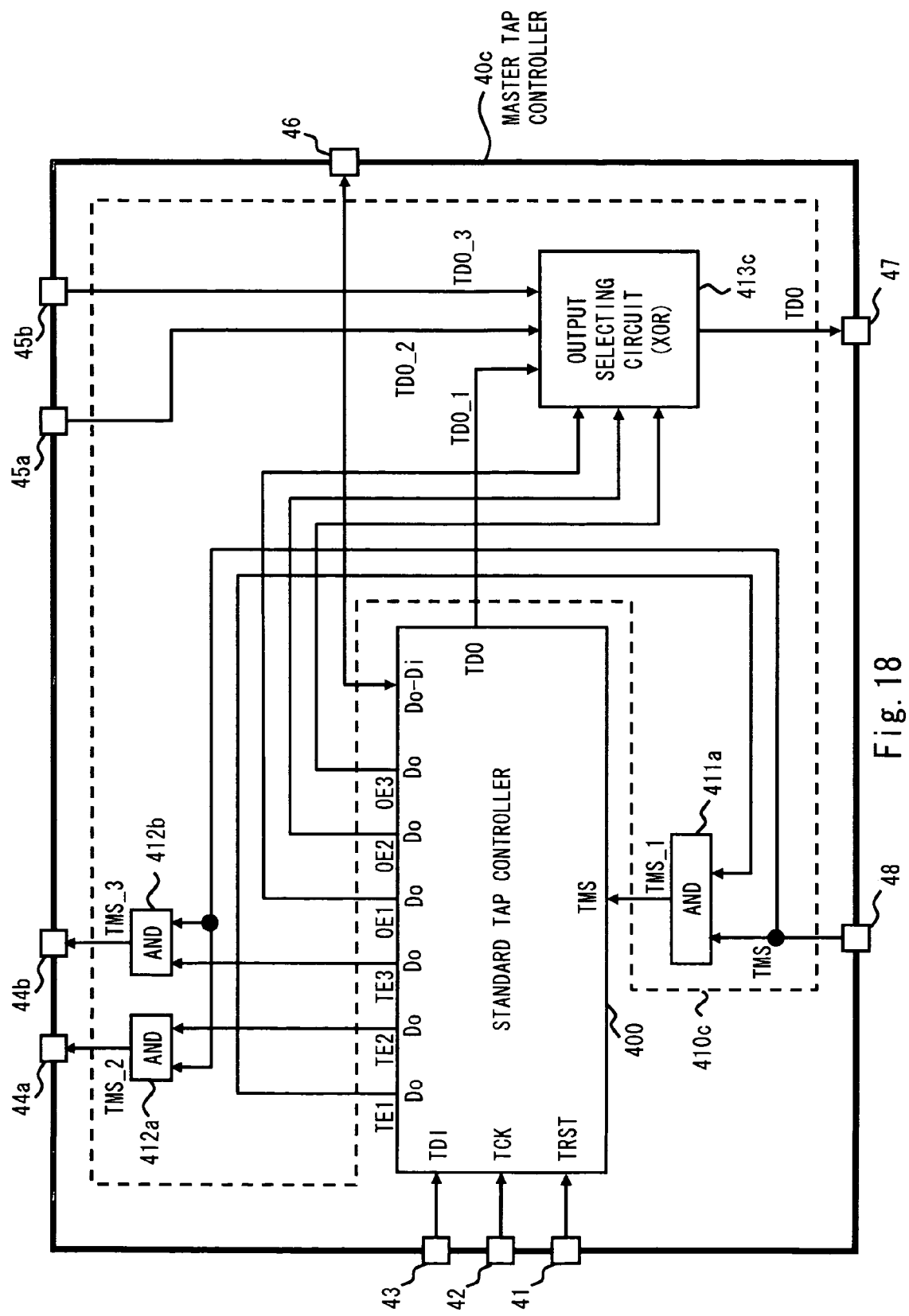
FIG. 18 is a block diagram of a master TAP controller according to an eighth embodiment.

FIG. 18 shows a block diagram of a master TAP controller 40c according to the eighth embodiment. As shown in FIG. 18, the master TAP controller 40c includes an output selecting circuit 413c in place of the output selecting circuit 413a of the master TAP controller 40a in the sixth embodiment. The output selecting circuit 413c outputs exclusive OR (XOR) of the output signal selected from among the output signals TDO_1 to TDO_3 that are input to the output selecting circuit 413c as the final output signal through the output terminal 47. In FIG. 18, the selecting circuit including the output selecting circuit 413c is made selecting circuit 410c.

FIG. 19 shows a truth table of the output selecting circuit 413c. As shown in FIG. 19, the output selecting circuit 413c outputs the XOR of the output signal selected according to the selection signals OE1 to OE3 as the final output signal TDO. Therefore, the output selecting circuit 413c performs XOR operation of the output signals TDO_1 to TDO_3 so as to compress data of the plurality of output signals.

In the eighth embodiment, the instruction code having 6-bit instruction length is used as the instruction code for selection. FIG. 20 shows an example of the instruction code for selection used in the eighth embodiment. As shown in FIG. 20, in the instruction code for selection used in the eighth embodiment, the code of "111111" is added to the instruction code for selection used in the seventh embodiment shown in FIG. 17. When the instruction code for selection is "111111", all of the selection signals TE1 to TE3 and OE1 to OE3 are made active.

From above description, the test circuit according to the eighth embodiment compresses data of the output signal in the output selecting circuit 413c. Therefore, the test circuit according of the eighth embodiment is able to read the outputs of the plurality of standard TAP controllers at one time. Therefore, the test circuit according to the eighth embodiment is able to read out the test result in higher speed than other embodiments.

Ninth Embodiment

Figure 21:
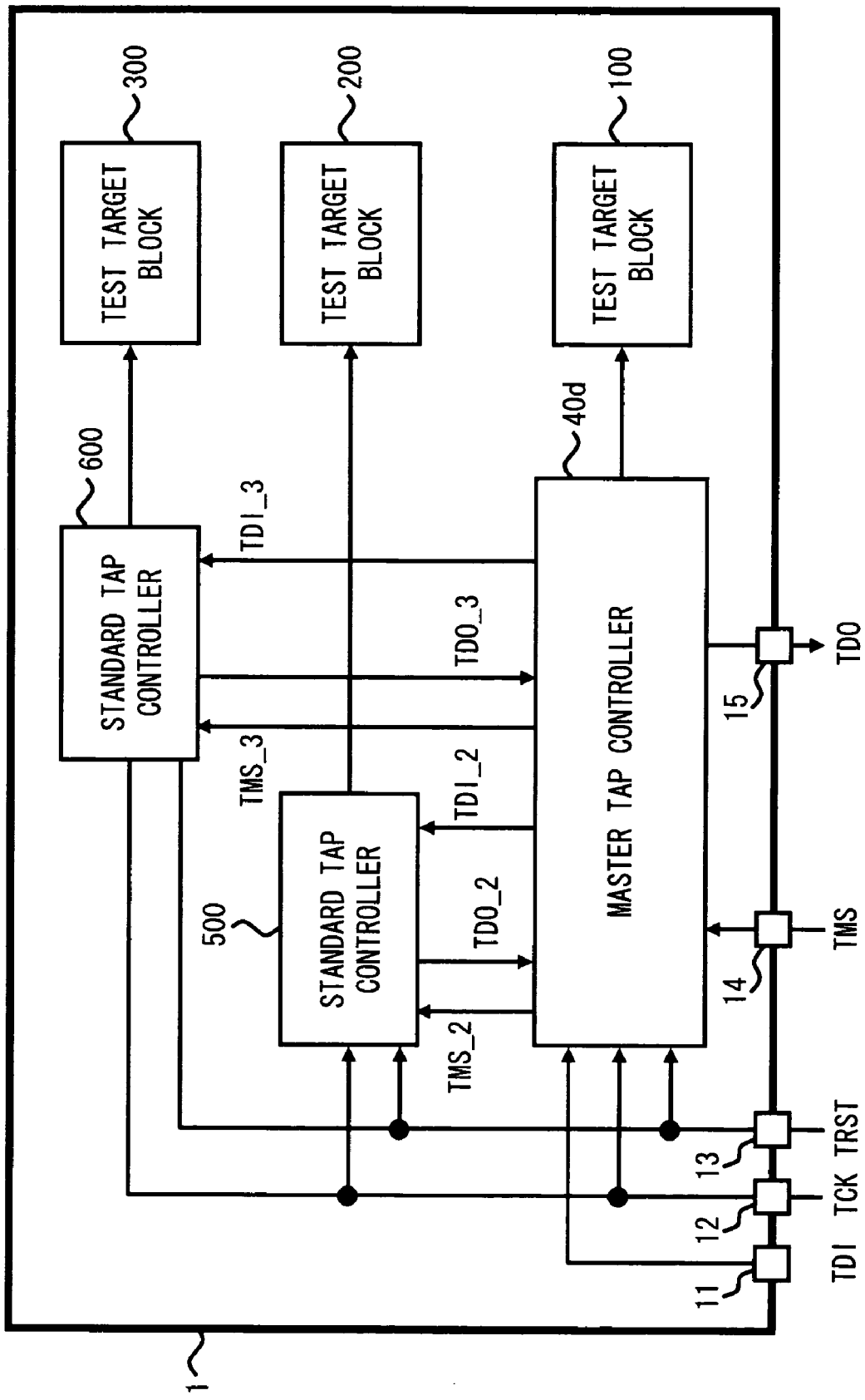
FIG. 21 is a block diagram of a semiconductor device according to a ninth embodiment.

FIG. 21 shows a block diagram of a semiconductor device 5 according to the ninth embodiment. As shown in FIG. 21, the semiconductor device 5 according to the ninth embodiment includes a master TAP controller 40d. In the above embodiments, the instruction code to each of the standard TAP controllers is input from the TDI terminal that becomes the common test terminal. On the other hand, in the test circuit according to the ninth embodiment, the instruction code input from the TDI terminal set as the common test terminal is input only to the master TAP controller 40d, and the instruction codes (TDI_2 and TDI_3) are input to other standard TAP controllers through the master TAP controller 40d.

Figure 22:
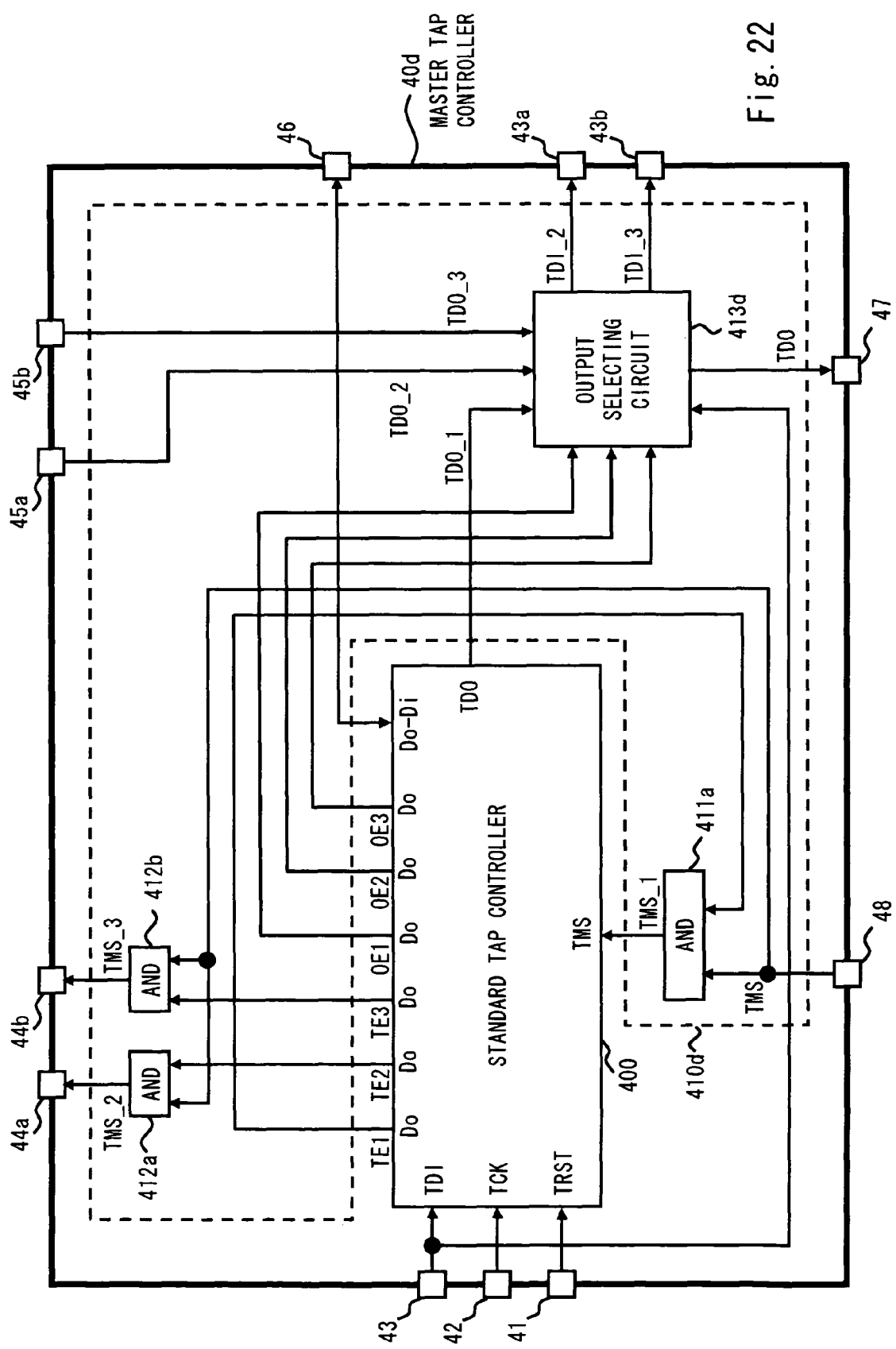
FIG. 22 is a block diagram of a master TAP controller according to the ninth embodiment.
Figure 24:
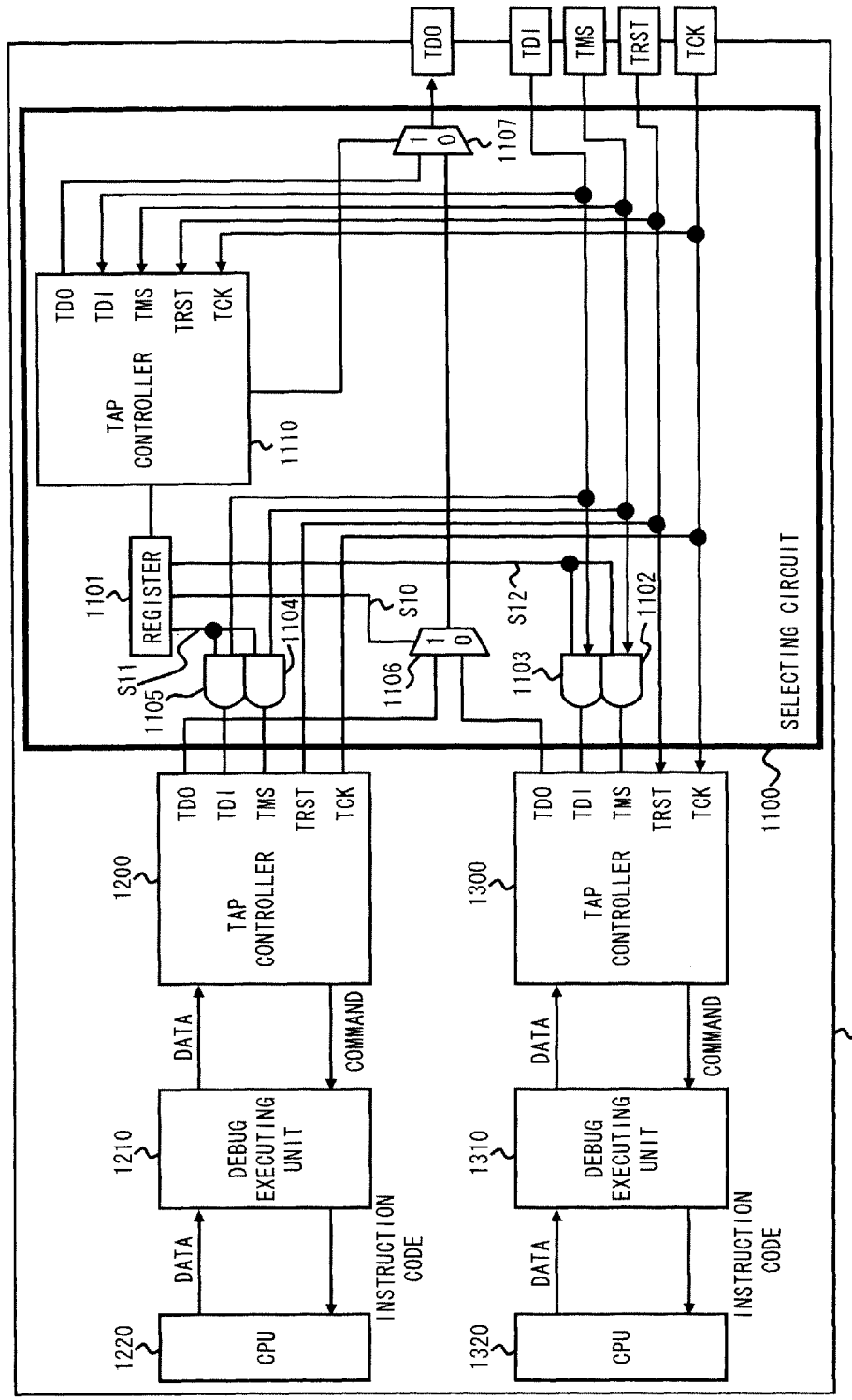
FIG. 24 is a diagram of a conventional semiconductor device.

FIG. 22 shows a block diagram of the master TAP controller 40d. As shown in FIG. 22, the master TAP controller 40d includes an output selecting circuit 413d in place of the output selecting circuit 413a in the master TAP controller 40a of the sixth embodiment. Further, in the master TAP controller 40d, the output terminals 43a and 43b outputting the instruction code to other standard TAP controllers are added. In FIG. 22, the selecting circuit including the output selecting circuit 413d is the selecting circuit 410d.

In the output selecting circuit 413, the instruction code in addition to the output signals TDO_1 to TDO_3 is input as the non-selection signal from the input terminal 43. The output selecting circuit 413d outputs the output signals TDO_1 to TDO_3 and the instruction code as any one of the instruction codes TDI_2 and TDI_3 and the output signal TDO in accordance with the values of the selection signals OE1 to OE3. FIG. 23 shows an example of a truth table of the output selecting circuit 413d. In the example shown in FIG. 23, if any one of the selection signals OE1 to OE3 is in active state, the output selecting circuit 413d outputs one of the output signals TDO_1 to TDO_3 selected in accordance with the value of the selection signal as the output signal TDO, and the instruction code TDI input from the external device is output as the instruction codes TDI_2 and TDI_3. On the other hand, if the plurality of selection signals of the selection signals OE1 to OE3 are active, any one of the output signals is output as the instruction code to other standard TAP controllers.

In the example of the truth table in FIG. 23, if the selection signals OE1 and OE2 are active, the output signal TDO_1 of the standard TAP controller 400 becomes the instruction code TDI_2 to the standard TAP controller 500. The output signal TDO_2 of the standard TAP controller 500 becomes the final output signal TDO. In this case, the instruction code TDI input from the external device is output as the instruction code TDI_3.

If the selection signals OE2 and OE3 are active, the output signal TDO_2 of the standard TAP controller 500 becomes the instruction code TDI_3 to the standard TAP controller 600. Then the output signal TDO_3 of the standard TAP controller 600 becomes the final output signal TDO. In this case, the instruction code TDI input from the external device is output as the instruction code TDI_2.

If the selection signals OE1 and OE3 are active, the output signal TDO_1 of the standard TAP controller 400 becomes the instruction code TDI_3 to the standard TAP controller 600. Then the output signal TDO_3 of the standard TAP controller 600 becomes the final output signal TDO. In this case, the instruction code TDI input from the external device is output as the instruction code TDI_2.

If the selection signals OE1, OE2, and OE3 are active, the output signal TDO_1 of the standard TAP controller 400 becomes the instruction code TDI_2 to the standard TAP controller 500. Further, the output signal TDO_2 of the standard TAP controller 500 becomes the instruction code TDI_3 to the standard TAP controller 600. Then the output signal TDO_3 of the standard TAP controller 600 becomes the final output signal TDO.

From the above description, in the test circuit according to the ninth embodiment, if the plurality of selection signals are set as active, each of the standard TAP controllers can be formed by cascade. In other words, in the semiconductor device 5 according to the ninth embodiment, the standard TAP controllers can be formed by chain connection. By doing so, the plurality of standard TAP controllers can be used as a scan chain, for example. Therefore, it is possible to set instruction code using one data sequence with respect to the plurality of standard TAP controllers and take out test result obtained from the plurality of standard TAP controllers as one data sequence. By connecting the standard TAP controllers by chain, it is possible to create test pattern with respect to the test where the plurality of test target circuits can be cooperatively operated with ease and to improve practicability of the test.

As stated above, according to the present invention, the instruction code for selection selecting any TAP controller from among the plurality of TAP controllers is newly provided. The instruction decoder decoding the instruction code for selection and the selecting circuit controlling other TAP controllers based on the decode result of the instruction decoder are provided in the master TAP controller. By doing so, the plurality of TAP controllers can be implemented without changing specification of the TAP controller of other standard specification than the master TAP controller and the sub-master controller and adding new terminals to one terminal group specified in IEEE1149 (terminal group formed of the TDI terminal 11, the TCK terminal 12, the TRST terminal 13, the TMS terminal 14, and the TDO terminal 15, for example). Since the master TAP controller and the sub-master TAP controller are the ones where a function of decoding the instruction code for selection is added to the TAP controller of the standard specification, the master TAP controller and the sub-master TAP controller can be used as the TAP controllers of the standard specification.

It is apparent that the present invention is not limited to the above embodiments, but may be modified and changed without departing from the scope and spirit of the invention. For example, the instruction code for selection is not limited to the one described in the embodiments above, but can be any as long as it complies with the standard of IEEE1149. It is also possible to use the selecting circuit such as those in the sixth embodiment to ninth embodiment in the sub-master TAP controller 50.

What is claimed is:

1. A test circuit including TAP (test access port) controllers specified in IEEE (Institute of Electrical and Electronics Engineers) 1149 and a test access port, the test circuit comprising:
a first controller including a first selecting circuit and a first TAP controller of the TAP controllers, the first selecting circuit generating an internal TMS (test mode select) signal in accordance with a TMS signal and selecting an output destination of the internal TMS signal in accordance with a selection signal, and the first TAP controller changing internal state based on the internal TMS signal, testing a corresponding test target block in accordance with instruction code for test, and generating the selection signal in accordance with instruction code for selection; and
a second controller including a second TAP controller of the TAP controllers changing internal state based on the internal TMS signal and testing a corresponding test target block in accordance with the instruction code for test,
wherein the selection signal comprises a first selection signal, the internal TMS signal comprises a first internal TMS signal and, the test circuit further comprises a third controller including a second selecting circuit and a third TAP controller, the second selecting circuit generating a second internal TMS signal in accordance with the first internal TMS signal and selections an output destination of the second internal TMS signal in accordance with a second selection signal, and the third TAP controller changing internal state based on the second internal TMS signal and generating the second selection signal based on the instruction code for selection.

2. The test circuit according to claim 1, wherein the first selecting circuit includes an output selecting circuit selecting from an output signal of the first TAP controller and an output signal of the second TAP controller in accordance with the selection signal and outputs one of the output signal of the first TAP controller and the output signal of the second TAP controller selected by the output selecting circuit as an output signal of the test circuit.

3. The test circuit according to claim 1, wherein the internal TMS signal is changed while maintaining a logic level that is the same as a logic level of the TMS signal.

4. The test circuit according to claim 1, wherein the second internal TMS signal is changed while maintaining a logic level that is the same as a logic level of the TMS signal.

5. The test circuit according to claim 1, wherein the test circuit includes a plurality of the second controllers and an arbitration circuit performing arbitration of output signals of a plurality of the second controllers and outputting the output signal.

6. The test circuit according to claim 1, wherein the test circuit includes a fourth TAP controller operating in accordance with the output signal of the second controller as instruction code.

7. The test circuit according to claim 1, wherein the first TAP controller includes a selection signal generating circuit decoding the instruction code for selection and outputting the selection signal.

8. The test circuit according to claim 1, wherein the first TAP controller makes a plurality of the selection signals to an active state and the first selecting circuit outputs a plurality of the internal TMS signals to a plurality of the second controllers based on a plurality of the selection signals.

9. The test circuit according to claim 1, wherein the first TAP controller outputs a third selection signal selecting at least one signal from output signals of the first and second TAP controllers and the output selecting circuit selects and outputs any one of the output signals of the first and second TAP controllers based on the third selection signal.

10. The test circuit according to claim 9, wherein, when between the output signals of the first and second TAP controllers are selected based on the third selection signal as a selected output signal, the output selecting circuit switches the selected output signals in accordance with a logic value of a clock signal.

11. The test circuit according to claim 9, wherein, when the output selecting circuit selects from the output signal of the first and second TAP controllers based on the third selection signal, the output selecting circuit outputs an exclusive OR of a plurality of the selected output signals as an output signal of the output selecting circuit.

12. The test circuit according to claim 9, wherein the output selecting circuit outputs the output signal from the first or second TAP controller selected based on the third selection signal as an instruction code to other TAP controllers.

13. The test circuit according to claim 12, wherein the output signals of the first and second TAP controllers and instruction code input from a first external device are input to the output selecting circuit, and the output selecting circuit outputs the output signal of the first or second TAP controller selected based on the third selection signal as the instruction code to other TAP controllers and the output signal of the first or second TAP controller to a second external device.

14. The test circuit according to claim 12, wherein the output signals of the first and second TAP controllers and instruction code input from an external device are input to the output selecting circuit, and the output selecting circuit outputs the output signal of the first or second TAP controller selected based on the third selection signal as the instruction code to other TAP controllers among the first TAP controller and the second TAP controller and the output signal of the first or second TAP controller to the external device.

15. The test circuit according to claim 1, wherein the first and second TAP controllers are specified in the IEEE 1149.

* * * * *